(12) United States Patent
Nys et al.

(10) Patent No.: US 8,970,227 B2
(45) Date of Patent: Mar. 3, 2015

(54) CIRCUIT FOR CAPACITIVE TOUCH APPLICATIONS

(75) Inventors: Olivier Nys, Neuchatel (CH); Hussein Ballan, Saint Legier (CH); Norman Chappatte, Estavayer-le-Lac (CH); François Vuadens, Blonay (CH)

(73) Assignee: Advanced Silicon SA, Lausanne (CH)

( * ) Notice: Subject to any disclaimer, the term of this patent is extended or adjusted under 35 U.S.C. 154(b) by 1186 days.

(21) Appl. No.: 12/881,489

(22) Filed: Sep. 14, 2010

(65) Prior Publication Data

US 2011/0001492 A1      Jan. 6, 2011

(51) Int. Cl.
*G01R 27/26* (2006.01)
*H03M 1/12* (2006.01)
*H03M 1/46* (2006.01)

(52) U.S. Cl.
CPC ............... *H03M 1/123* (2013.01); *H03M 1/46* (2013.01)
USPC ........ 324/658; 178/18.06; 341/161; 341/162; 345/173

(58) Field of Classification Search
CPC ..................... G01R 15/16; G06F 2203/04103
USPC ........ 324/658, 686, 661; 345/173; 178/18.06; 341/161, 162
See application file for complete search history.

(56) References Cited

U.S. PATENT DOCUMENTS

| | | | |
|---|---|---|---|
| 5,543,591 A | 8/1996 | Gillespie et al. | |
| 5,790,107 A | 8/1998 | Kasser et al. | |
| 5,875,109 A * | 2/1999 | Federspiel | 700/40 |
| 6,667,707 B2 * | 12/2003 | Mueck et al. | 341/172 |
| 7,053,806 B1 | 5/2006 | Rao et al. | |
| 7,312,616 B2 | 12/2007 | Snyder | |
| 7,656,394 B2 | 2/2010 | Westerman et al. | |
| 7,663,607 B2 | 2/2010 | Hotelling et al. | |
| 7,948,244 B2 * | 5/2011 | Mijuskovic et al. | 324/658 |
| 8,390,361 B2 * | 3/2013 | Ningrat | 327/337 |
| 2003/0205660 A1 | 11/2003 | Takahashi et al. | |
| 2004/0004488 A1 * | 1/2004 | Baxter | 324/678 |
| 2004/0183549 A1 * | 9/2004 | Takayanagi | 324/658 |
| 2004/0189587 A1 * | 9/2004 | Jung et al. | 345/102 |
| 2004/0210801 A1 * | 10/2004 | Prasad et al. | 714/700 |
| 2004/0212431 A1 * | 10/2004 | Butler | 330/261 |
| 2005/0209803 A1 | 9/2005 | Yamaguchi | |
| 2006/0139198 A1 * | 6/2006 | Rao et al. | 341/155 |
| 2008/0158175 A1 | 7/2008 | Hotelling et al. | |
| 2010/0207795 A1 * | 8/2010 | Waki et al. | 341/143 |
| 2012/0229421 A1 * | 9/2012 | Kim et al. | 345/174 |

FOREIGN PATENT DOCUMENTS

| | | |
|---|---|---|
| EP | 2180599 A1 | 4/2010 |
| EP | 2224596 A2 | 9/2010 |

(Continued)

OTHER PUBLICATIONS

International Search Report for CH 2010/1475 dated Dec. 2010.

*Primary Examiner* — Huy Q Phan
*Assistant Examiner* — Giovanni Astacio-Oquendo
(74) *Attorney, Agent, or Firm* — Blank Rome LLP

(57) ABSTRACT

A circuit for capacitive touch applications has a charge integrator, a low pass-filter, and a correlated double sampler having an input capacitor. The circuit also includes a sampler and holder, and an analog to digital converter. The low pass-filter has a cut-off frequency lower than the Nyquist frequency of the sampler and holder, and the low pass filter includes input capacitor and a serial resistor.

13 Claims, 33 Drawing Sheets

(56) References Cited

FOREIGN PATENT DOCUMENTS

| | | | |
|---|---|---|---|
| JP | H11251903 A | 9/1999 | |
| JP | 2002-051264 * | 2/2002 | ............ H04N 5/335 |
| JP | 2002051264 A | 2/2002 | |
| JP | 2005269215 A | 9/2005 | |

\* cited by examiner

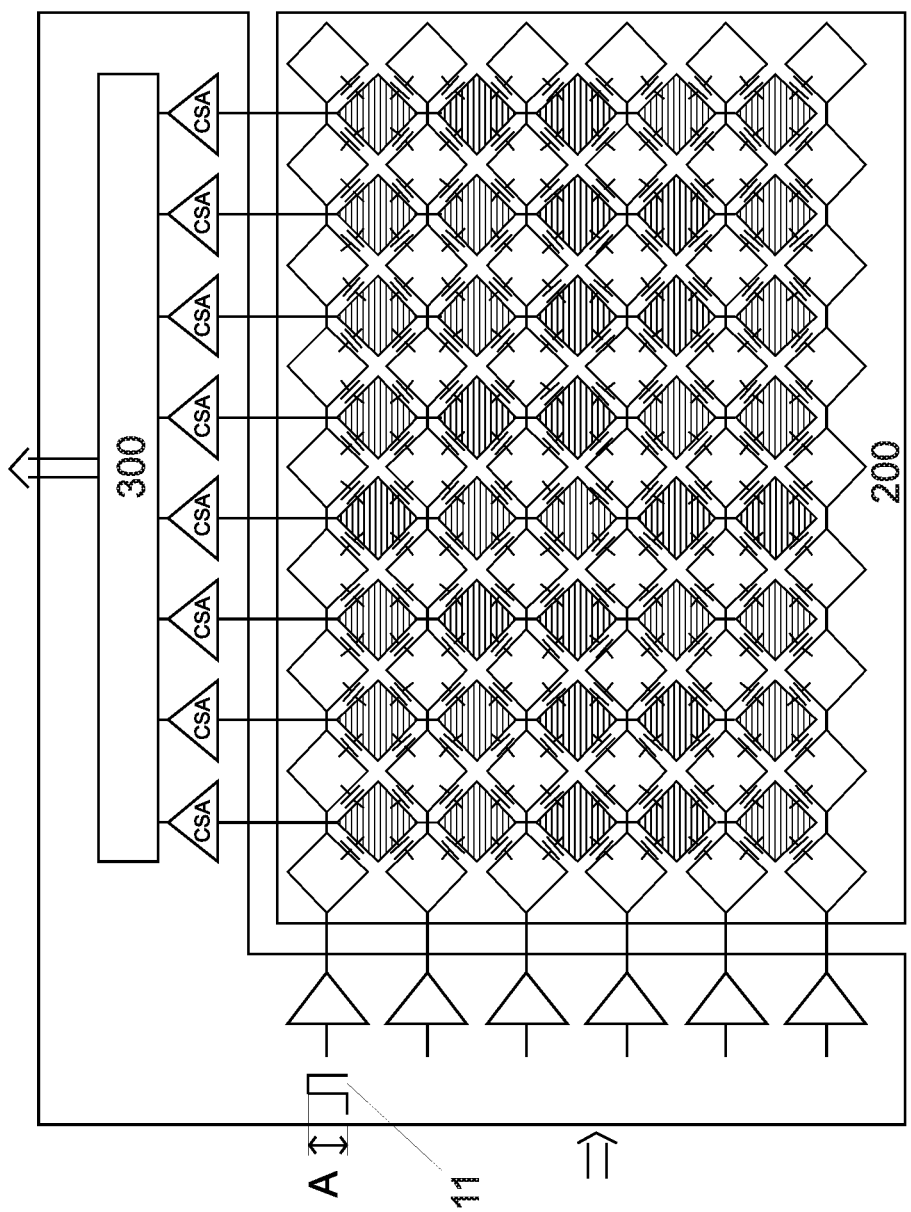

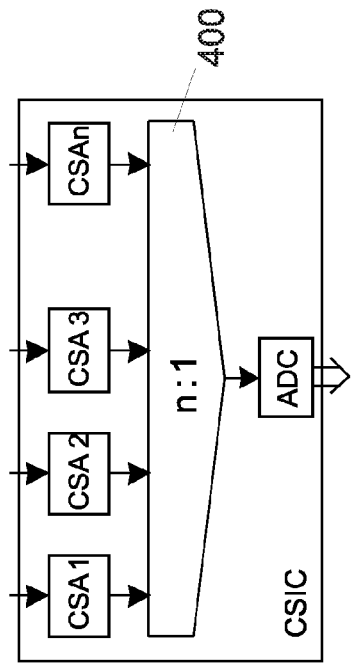
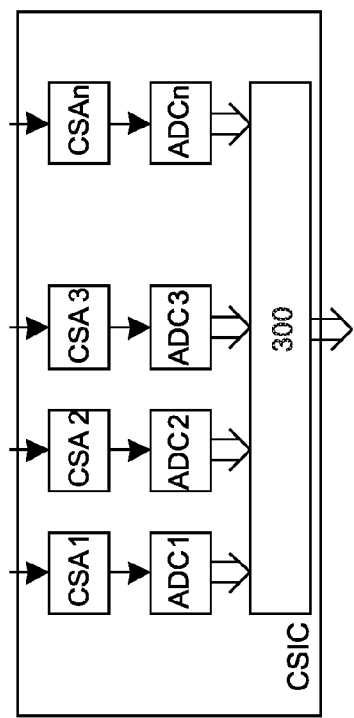
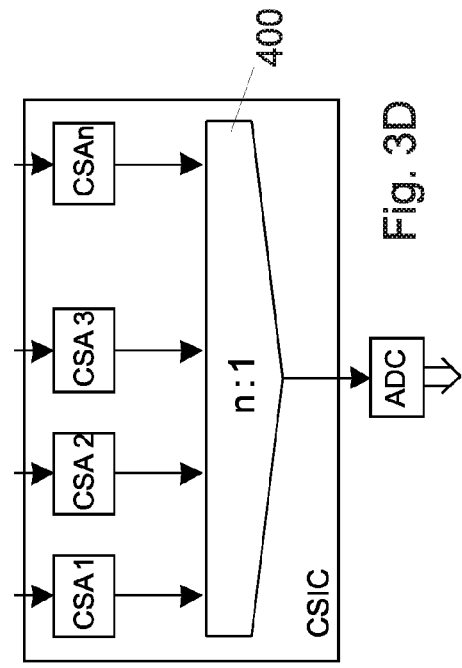
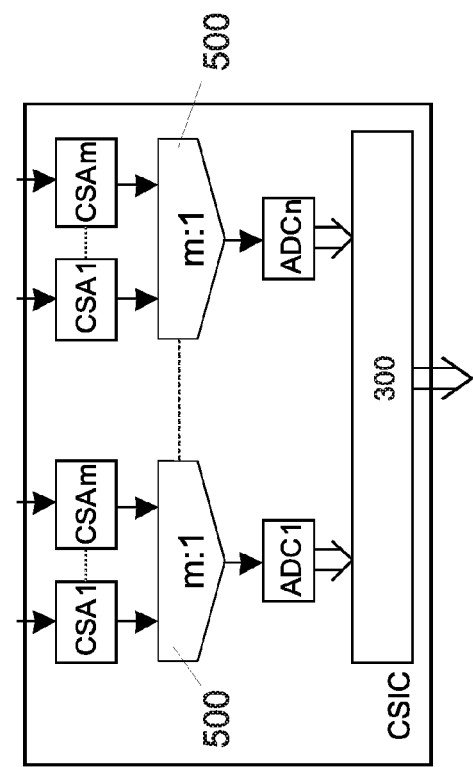

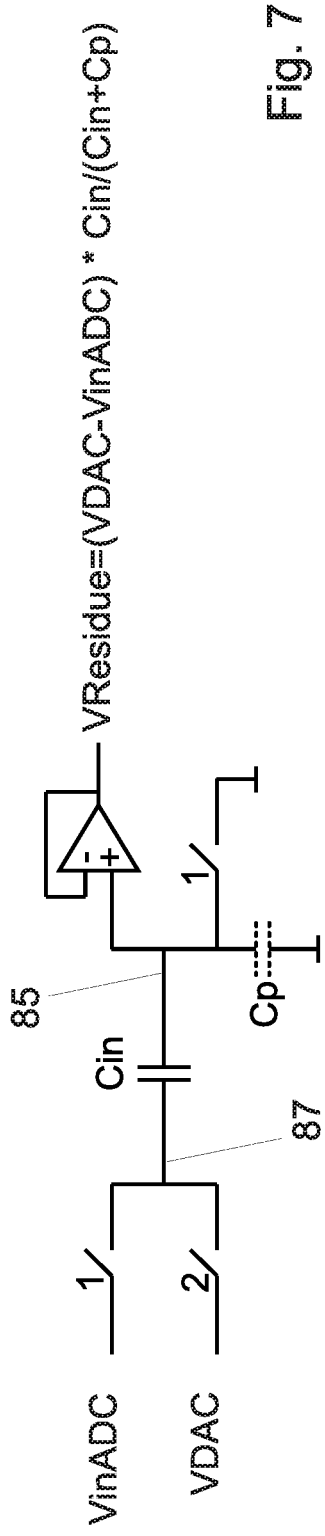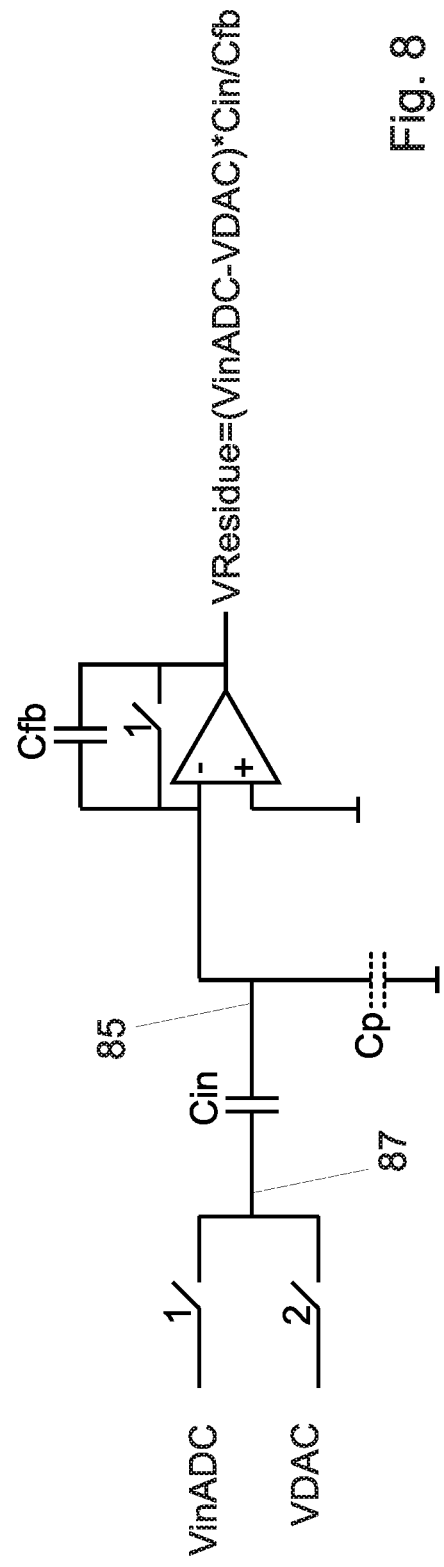

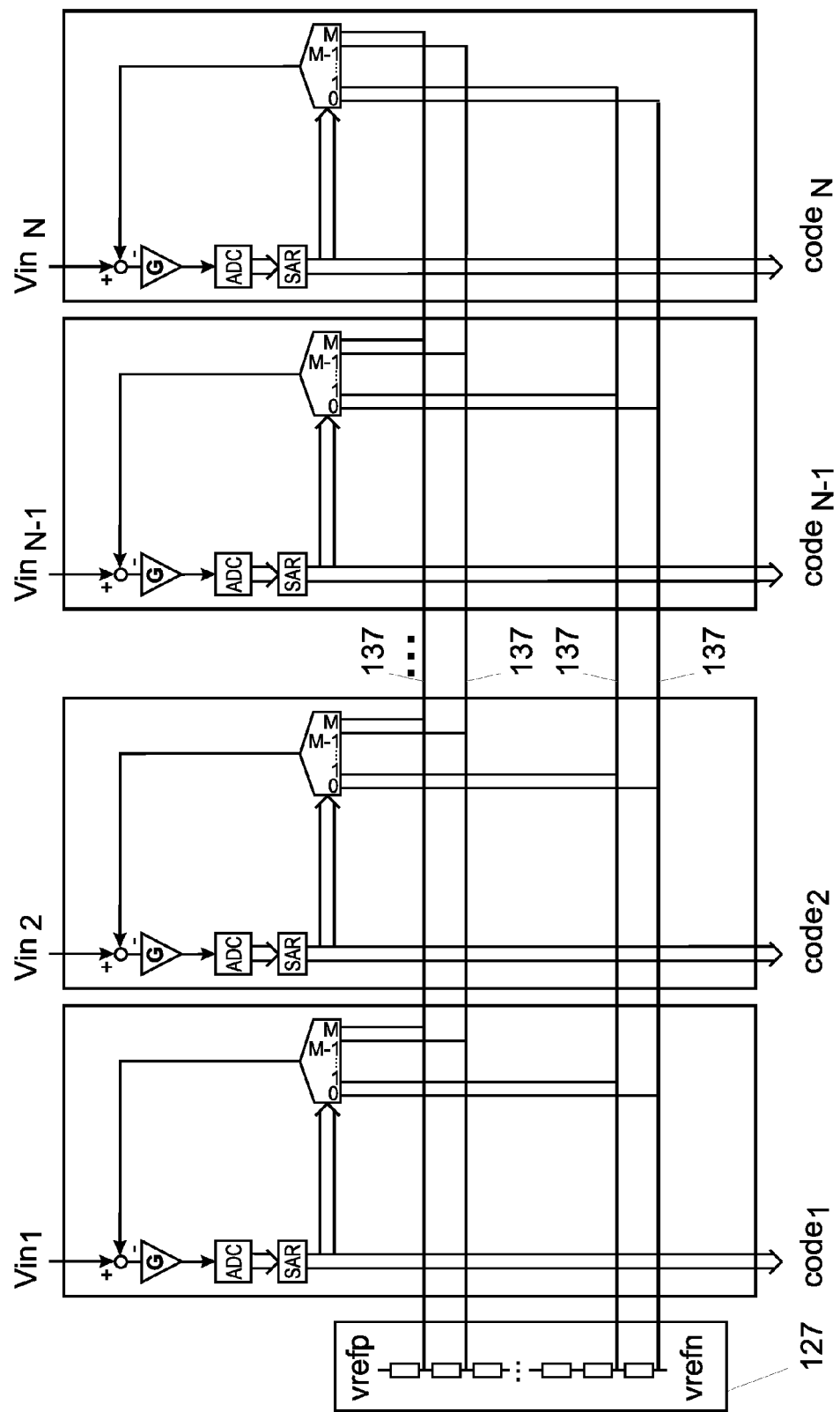

CIRCUIT FOR CAPACITIVE TOUCH APPLICATIONS

REFERENCE DATA

This application is related to European Patent Application EP2180599 filed on 24 Oct. 2008, the contents whereof are hereby incorporated.

FIELD OF THE INVENTION

The present invention concerns a circuit with digital output, typically used in capacitive touch applications.

DESCRIPTION OF RELATED ART

Capacitive sensors are used in various application fields in which object presence detections are involved, such as, but not limited to, touch pads, touch panels, touch screens or projective capacitive displays.

FIG. 1 describes a possible capacitive sense measurement circuit 10. Each sensing capacitor $C_{sens}$ is connected to the input of the first block 1—a charge integrator—of the acquisition chain 10. Since the non-inverting input terminal of the charge integrator amplifier is kept to a constant voltage, there is a virtual ground at the inverting input terminal of this amplifier, i.e. also the input voltage of the charge integrator amplifier is kept constant. The charge sensing against a virtual ground allows power supplies noise immunity. A reset phase forces the output voltage $V_{int}$ of the charge integrator 1 to a well defined initialization value. After the reset phase, the initial value of the output voltage $V_{int}$, i.e. $V_{int\_init}$, of the charge integrator 1 is filtered and sampled by the remaining blocks of the chain 10. Then the charges may be transferred from the sense capacitor $C_{sens}$ to the integrating capacitor $C_{int}$ of the charge integrator 1. After all the charges have been transferred, the output voltage $V_{int\_final}$ of the charge integrator 1 will be:

$$V\ int\_final = V\ int\_init - \frac{Q}{C\ int}$$

where Q is the transferred charge. Any change in the charges stored into the sensing capacitor $C_{sens}$, resulting for example from a capacitance change, will be seen as a voltage change at the output of the integrator $V_{int}$.

Various implementation schemes of the charge integrator 1 based on the use of a current source and an internal integration capacitors $C_{int}$ for measuring the charge change of a sense capacitor $C_{sens}$ are known by the literature and different patents and could be considered by the skilled person.

The second block 2' shown in FIG. 1 is a low pass filter. Its purpose is to remove high frequency components from the Vint without significantly attenuating it. In particular, a purpose of this low-pass filter is to limit the bandwidth of the signal Vint in function of the sampling rate of the subsequent sampling block 3, taking into account the Nyquist relation. Therefore, the cut-off frequency of this low pass filter, i.e., the point in the filter response where the unaffected low frequency band and the high frequency band meet, for example as defined by a 3 dB corner, is lower than the Nyquist frequency of the sampling block 3.

Advantageously, the capacitive sense measurement circuit 10 comprises as a third block 2" a Correlated Double Sampling (CDS) block: its function is to sample twice its input, once in a known condition and once in an unknown condition, for removing an undesired offset or noise. The value measured from the known condition, e.g. a reset state, is then subtracted from the unknown condition, e.g. a charge transferring, to generate a differential signal, output of this block 2".

The fourth block 3 is a sampler and holder (S/H). It is required to store the output of the CDS at the end of the charge transfer phase and keep it available for the whole duration of the A/D conversion 4 in order to allow a new charge to be sampled while the current one is being converted into digital by the last block, the ADC 4 itself.

The circuit proposed in FIG. 1 contains several stages, each of which generates noise, requires area on a silicon slice and is supplied by a current. In a touch panel comprising a large amount of sensing capacitors, the required surface and power consumption become problematic.

U.S. Pat. No. 5,543,591 (Synaptics) describes a device in which the charge sensing is performed by the current integration against power supplies. This feature makes the device sensitive to the power supply noise. Even if the low frequency noise is cancelled by a double polarity averaging, the noise rejection efficiency is dependent on the timing sharpness. Four input lines or channels, each line or channel comprising a current integration device, a filter and a sampler and holder (S/H), are multiplexed into one channel which is the input of an analog to digital converter (ADC) not specified. The ADC sharing between four channels limits the conversion rate and makes worse the spatial non-linearity, i.e. the non-linearity on the difference between adjacent channels. The described device is moreover integrated in a touch panel in which all row electrodes and all row column electrodes are sensed simultaneously.

U.S. Pat. No. 5,790,107 (Logitech/Elan) describes a device in which the charge sensing is performed by a frequency measurement between a reference oscillator and an oscillator comprising a sensing capacitor. A voltage signal representing the frequency measurement is then mixed with the voltage reference and the output of the mixer is sent to a low pass filter (LPF) realized with a flip-flop and then used for driving a digital counter, without using ADC. The proposed circuit does not perform a low frequency noise cancellation. Moreover the charge sensing is sensitive to the reference oscillator accuracy.

U.S. Pat. No. 7,312,616 (Cypress) concerns a successive approximated capacitance measurement circuit in which the charge sensing is performed by a measurement of an effective resistor, generated by charging and discharging, with a current source tied to a switch, a sensing capacitor at high frequency ($R_{eff}$ proportional to $(f_{switch} \cdot C_{sensing})^{-1}$). The circuit comprises also an adjustable LPF for voltage averaging. The LPF output voltage is then compared to a voltage reference and sent to a Successive Approximation ADC (SAC). The chain contains neither CDS nor S/H. Again, the proposed circuit does not perform a low frequency noise cancellation.

U.S. Pat. No. 7,656,394 (Apple) concerns a device used in multi-touch panels wherein the charge sensing is performed by sequential charge sharing between a sensing capacitor and an integration capacitor by using three switches and a voltage source. The number of required phases depends on the desired output voltage precision. Before the ADC conversion, the panel image without touches, stored in a memory from a calibration phase, is removed from the output voltage. The ADC topology is not defined and there is neither LPF nor CDS. Charge sensors along with the ADC can be shared or dedicated. Again, the proposed device does not perform a low frequency noise cancellation.

U.S. Pat. No. 7,663,607 (Apple) describes a touch panel wherein the charge sensing is performed by charge integration against virtual ground. The device then has a good power supply noise immunity. However a number N of charge sensing channels is multiplexed into only one ADC channel input, whose topology is not defined. Since the use of one ADC for N channels, the conversion rate is low compared to other solutions. Moreover also in this case there is not a low frequency noise cancellation.

According to the state of art, a circuit for capacitive touch applications with a simpler structure than other known solutions is needed. A circuit with a reduced low frequency noise is also needed.

In addition, a circuit with a better and non limited conversion rate and a reduced spatial non-linearity is needed.

BRIEF SUMMARY OF THE INVENTION

According to the invention, these aims are achieved by means of a circuit for capacitive touch applications according to claim 1, by means of a method according to claim 16 and by means of a capacitive touch device according to claim 20.

The advantages of the circuit, comparing with the prior art, include in particular the possibility of reducing the number of required blocks, by combining several functions within the same block, i.e. by integrating blocks. This results in a reduction of total surface and of power consumption.

Advantageously the input capacitor of the CDS block is combined with a serial resistor for making the Low Pass Filter LPF. In this manner the LPF and CDS functions are combined in a single block. The resistance value of this serial resistor allows, along with the capacitance value of the input capacitor, to determine the cut-off frequency of the filtering function performed by the merged block LPF+CDS, depending on the sampling rate of the subsequent sampling block 3 in order to satisfy the Nyquist criteria.

Moreover one buffer can be avoided, together with its power consumption part and its noise contribution. In other words the LPF and the CDS blocks are integrated in a single block.

In this context, the expression "integrate two or plus blocks in a single block" means that at least one circuit element is shared between the integrated blocks, and performs a function in each of those blocks. Thus, it is not possible to isolate each block. Therefore, since at least one element is shared between two blocks, the number of elements of the integrated block is lower than the number of elements that would be required in order to build two (or more) equivalent separated blocks without any shared element, allowing to reduce the noise level, the current consumption and the required area on a silicon slice.

The ADC of the proposed chain is a switched capacitor ADC, for example a multistage ADC, comprising a first stage and further stages. The first stage can contain a Successive Approximation Register (SAR) and a DAC in feedback. In such a case the S/H block and this first stage are integrated in a single block, i.e. an amplifier is shared by the S/H block and the first stage of a switched capacitor ADC. The further stages can comprise a pipeline ADC, an algorithmic ADC or a two or more cascaded component, each component being an algorithmic ADC.

According to an independent aspect of the invention, the first stage of the ADC, including the integrated S/H, can be integrated in a single block along with the LPF+CDS.

In one embodiment a capacitor is shared between the LPF+CDS and S/H+ADC blocks, performing the function of the feedback capacitor of the LPF+CDS block and the input capacitor of the S/H+ADC block.

In another embodiment wherein the S/H+ADC block comprises an amplifier, not only the mentioned capacitor, performing the function of the feedback capacitor of the LPF+CDS block and the input capacitor of the S/H+ADC block, but also an amplifier, integrating the function of the amplifiers of the LPF+CDS and S/H+ADC blocks, are shared between the two blocks.

Advantageously, the DAC's in the feedback loop of the first stage can be realized by selecting tabs from a common resistive divider in order to have a good spatial non-linearity.

In another embodiment the resolution of the ADC is improved by generating and evaluating an error or residue, which is defined as the amplification of the difference between the input signal of the LPF+CDS block and its approximation generated by the SAR and the DAC in feedback.

In one embodiment the proposed circuit allows the optimization of the CSA and/or the LPF+CDS by offset variation.

BRIEF DESCRIPTION OF THE DRAWINGS

The invention will be better understood with the aid of the description of an embodiment given by way of example and illustrated by the figures, in which:

FIG. 2 shows a view of a capacitive touch device with a capacitive sensor integrated circuit.

FIG. 3A to 3D show different possible implementations of a capacitive sensor interface circuit (CSIC).

FIGS. 7 and 8 respectively show two possible structures of the analogue difference stage of the S/H+ADC block.

FIGS. 27 to 29b illustrate schematically three variants of the circuit from the CSA block according to some embodiments of the invention.

DETAILED DESCRIPTION OF POSSIBLE EMBODIMENTS OF THE INVENTION

Figure 1:
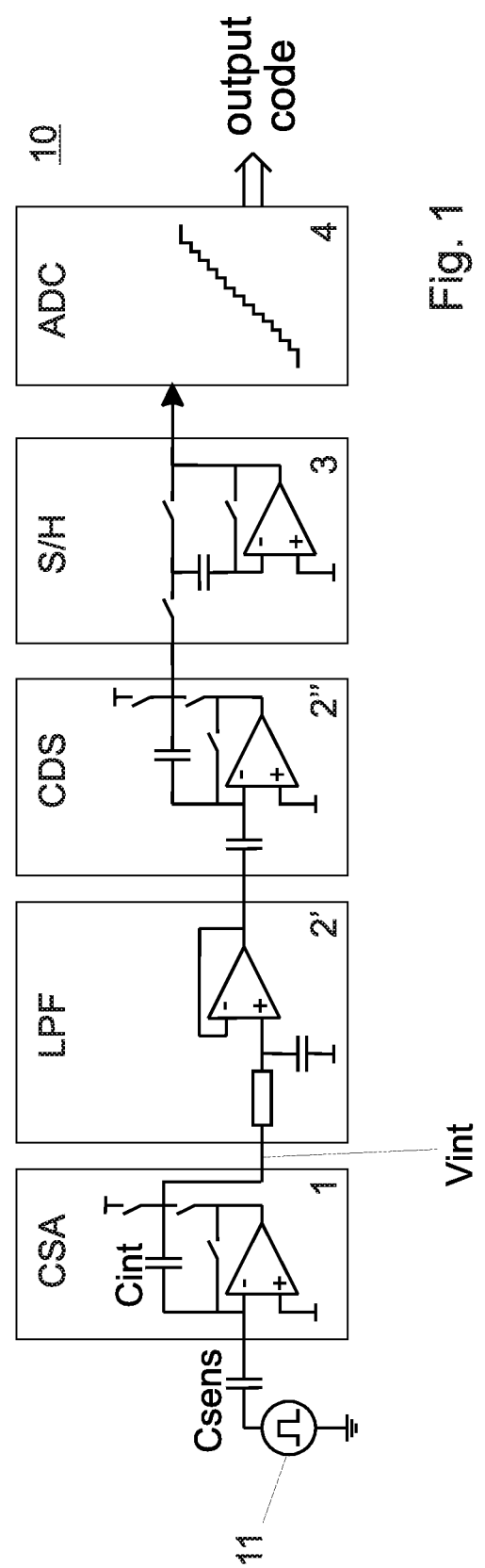
FIG. 1 shows an implementation of a capacitive sensing circuit with a digital output.

A capacitive touch device, for example a touch panel, comprises an array of sensing capacitors. If an object with good dielectric properties such as a finger is approaching the touch panel, the capacitance value of these capacitors can be changed. The whole array is read out by a capacitive sensor integrated circuit (CSIC) in medium speed, typically 100-1000 fps.

FIG. 2 shows a view of a capacitive touch device with a CSIC. It comprises a first number N of rows of sensing capacitors and a second number M of columns of sensing capacitors. The sensing capacitors are all arranged in a matrix form, like pixels in an image. In one embodiment N and M can be the same number, i.e. N=M. In other words the capacitive touch device comprises a capacitive sensor array 200 of dimensions N×M.

A voltage 11 of amplitude A is applied as input signal across each row of the sensing capacitors. In a possible operation scheme, each row is addressed sequentially by the input signal 11 with a row scan rate 1/N. While a row is being addressed, all M sensors of the selected row are analysed in parallel by M sensing circuits of the invention, during the row scan period.

The blocks Charge Sense Amplifiers (CSAs) scale with an appropriate range a detected signal for each column or channel of the capacitive touch device. In other words the charge sense amplification is performed by a dedicated circuitry within each channel of the CSIC, so that all the capacitive sensors of a row are sampled in parallel.

The scaled signal is then converted into a digital output code. For the A/D conversion (ADC) however, various architectures shown through FIG. 3A to FIG. 3D can be implemented:

FIG. 3A shows a CSIC with an ADC in each channel, as for the CSA. The reference 300 indicates a digital interface used for the detection of the change of the sensing capacitor values within each scan.

In FIG. 3B the voltage outputs of the CSA of all channels are fed through a high frequency multiplexer 400 to a high speed ADC. In this case, as for each row, all the columns have to be scanned one after the other, and the ADC must have a conversion rate N times higher than when the ADC are implemented in each channel. Although the number of ADC is reduced, the speed constraints on the ADC can then become severe for large number of channels. In this case the digital interface is not mandatory because the number of output ports is already limited.

The CSIC illustrated in FIG. 3C uses an ADC per group of CSA channels, each group having a multiplexer 500.

In another embodiment shown in FIG. 3D, the CSIC has an analog output which only includes one CSA per channel and a high frequency analog multiplexer 400, the output of which is fed outside the CSIC to a fast and external ADC.

The present invention concerns the implementation scheme of an electronic architecture per channel compliant for all the different configurations shown in FIGS. 3A to 3D. The embodiment of FIG. 3A is particularly suited for a parallel sensing capability and fast digital processing.

Figure 4:
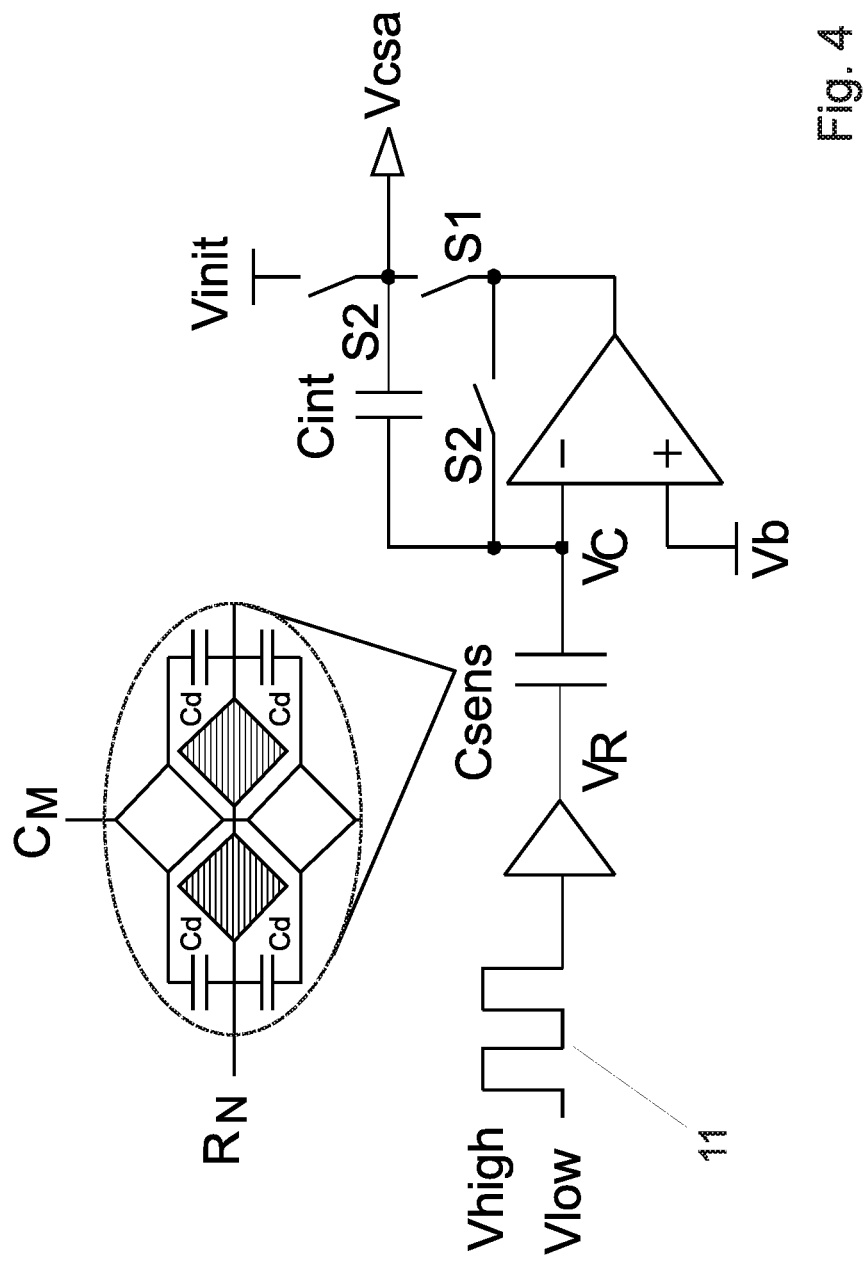
FIG. 4 shows one embodiment of the charge sense amplifier according to the invention.

The first block of the circuit according to the invention is the charge sense amplifier shown in FIG. 4: it comprises a low noise inverting sense amplifier that uses the capacitance of the sensor $C_{sens}$ in the gain loop of the amplifier. The sensing capacitor $C_{sens}$ is the equivalent capacitor present between the terminal of the selected row and the terminal of the column under acquisition, as pointed out in the upper part of FIG. 4.

The voltage $V_R$ at the input of the sensing capacitor $C_{sens}$ is the amplification of the scan input voltage amplitude ($V_{high}-V_{low}$) 11. Since the non-inverting input terminal of the charge integrator amplifier is kept to a constant voltage, there is a virtual ground at the inverting input terminal of this amplifier, i.e. also the input voltage of the charge integrator amplifier is kept constant. Any change in the sensor capacitance value $C_{sens}$ will result in a proportional change of the CSA output $V_{csa}$ according to the following relation:

$$V_{csa} = -(V_{high} - V_{low})\frac{C_{sens}}{C_{int}}$$

The output voltage $V_{csa}$ is then proportional to the scan input voltage amplitude ($V_{high}-V_{low}$).

Figure 5:
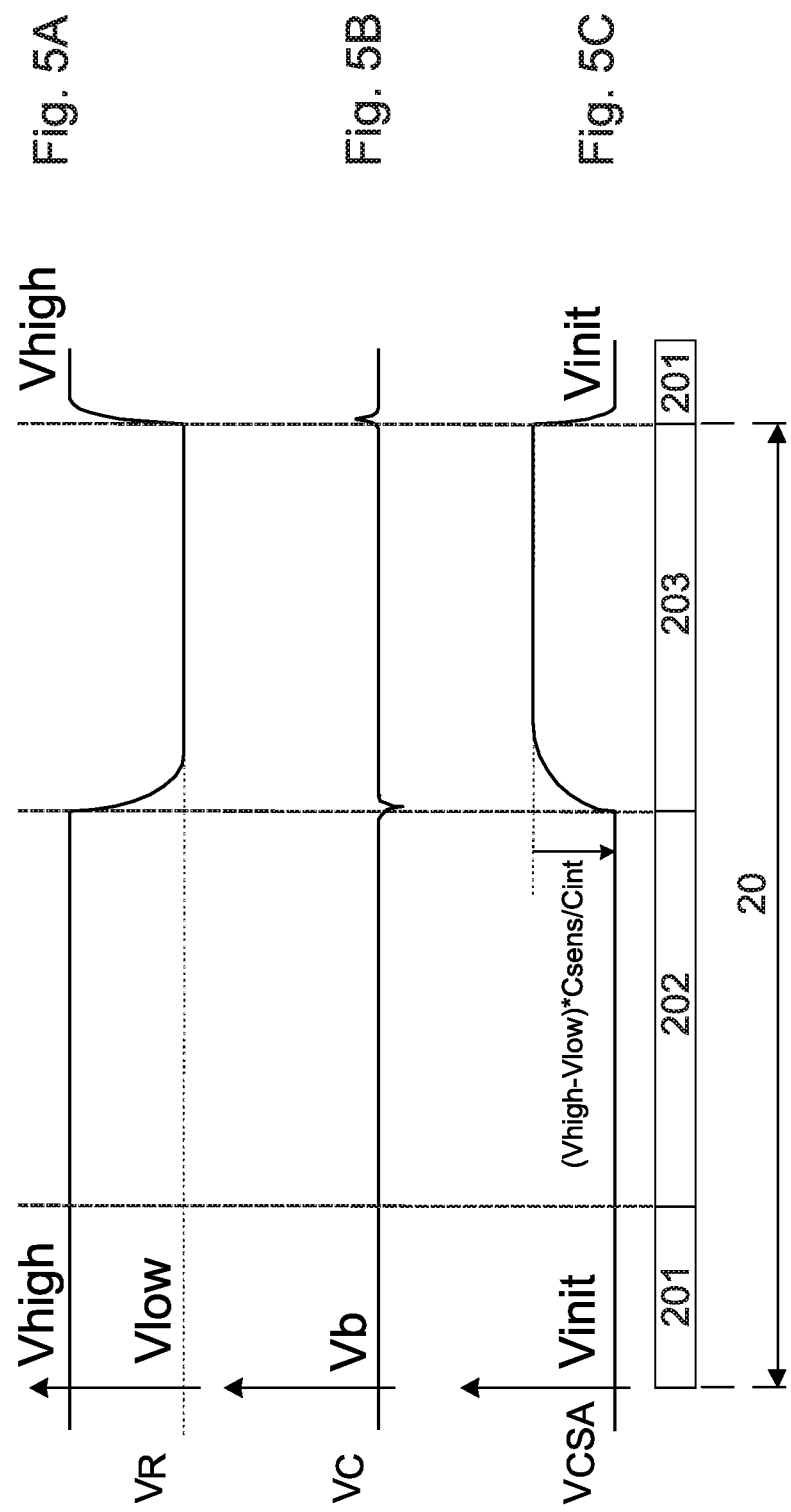
FIG. 5A to 5C show the acquisition cycle respectively of three voltages in the charge sensing circuit.

The voltage acquisition cycle sequence of the CSA stage is shown in FIG. 5A to 5C. At the start of a line scan, and while the amplified scan voltage $V_R$ is maintained high, the input voltage $V_c$ of the inverting terminal of the CSA, connected to the feedback capacitor $C_{int}$, is initialized to a reference voltage value $V_b$, while the CSA output is initialized to a reference voltage value $V_{init}$, by closing the switches S2 and opening switch S1. Following the reset phase 201, the noise integration phase can start while an ADC input stage, which belongs to the circuit as it will be shown, is being initialized. This is achieved by closing the switch S1 and opening switches S2. During this phase the scan voltage is maintained high.

During these reset 201 and initialization phases 202, the column voltage of the sense capacitor terminal $V_c$ is maintained to the virtual ground voltage value $V_b$ while the output voltage of the CSA $V_{CSA}$ is maintained to the initialization voltage value $V_{init}$. At the end of the initialization phase 202 the voltage sampling is initiated by switching the input voltage from $V_{high}$ to $V_{low}$. Thus the output voltage of the CSA $V_{CSA}$ will amplify the negative voltage difference of the input row signal proportionally to the ratio between the sense capacitor $C_{sens}$ and the feedback capacitor $C_{int}$. The value of this negative voltage difference is $$-(V_{high}V_{low})\frac{C_{sens}}{C_{int}}$$

During this sampling phase 203, this amplified signal is being filtered and processed by the following stages.

Figure 6:
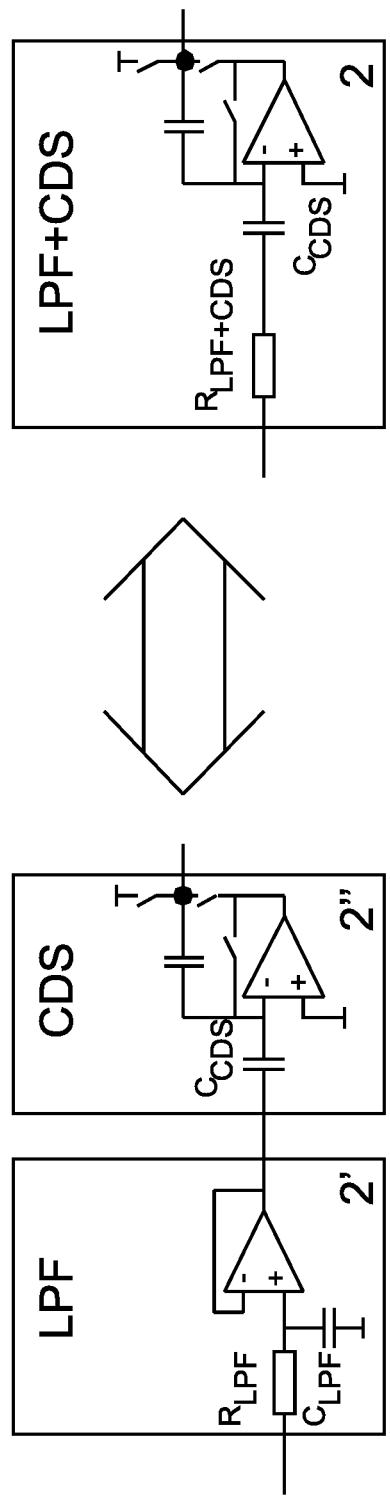
FIG. 6 shows the integration of the low pass filter and the correlated double sampling in one block according to one embodiment of the invention.

The left side of FIG. 6 shows LPF (Low Pass Filter) 2' and CDS (Correlated Double Sampling) 2" blocks. According to an aspect of the invention, these two blocks can be integrated in a single block 2 shown in the right part of the FIG. 6, by using directly the input capacitor of the CDS block $C_{CDS}$ and a supplementary serial resistor $R_{LPF+CDS}$ in order to perform the functions of a RC filter. The value of the resistor $R_{LPF+CDS}$ is adapted to the value of the input capacitor $C_{CDS}$ in order to limit the bandwidth of the input signal of the block 2 in function of the sampling rate of the subsequent sampling block, taking into account the Nyquist relation.

Doing so, the buffer of the block LPF 2' may be avoided, together with its power consumption budget part and its noise contribution. The integrated block LPF+CDS 2 moreover has only one capacitor ($C_{CDS}$) instead of the two capacitors ($C_{LPF}$ and $C_{CDS}$) required respectively by the two blocks LPF 2' and CDS 2". The cut off frequency is selected and can be varied by the nominal value of the serial resistor $R_{LPF+CDS}$.

If a more efficient filtering is required, for example when the energy of signals just above the cut-off frequency is high, this RC filtering stage can be combined with additional low-pass and/or band-pass filtering means, for example in multi-stage filter. The use of a single stage low pass filter that comprises only one resistor and one capacitor is however preferred since it reduces the number of components in each channel.

The circuit according to the present invention is simpler than non merged solutions, for example the solution illustrated in FIG. 1, because two or more blocks of the circuit shown in FIG. 1 are integrated into a single block, i.e. at least one circuit element is shared between the integrated blocks, and performs a function in each of those blocks. Thus, it is not possible to isolate each block. Therefore the number of elements of the integrated block is lower than the number of elements that would be required in order to build two (or more) equivalent separated blocks without any shared element, allowing to reduce the noise level, the current consumption and the required area on a silicon slice.

Furthermore, since many ADC of different types inherently need a sampler and holder, this sampler and holder, i.e. the block 3 of FIG. 1, and an ADC 4 can also be integrated. This is in particular possible for switched capacitor implementation of ADC's such as successive approximation, two-steps or multi-step, pipeline and algorithm ADC's.

In this context and in the drawings, the expression "S/H+ADC" means the integration of the S/H block 3 of FIG. 1 with a switched capacitor ADC, for example the integration of a S/H block with the first stage of a multistage ADC comprising a successive approximation register SAR, i.e. a SAC, and a feedback digital to analog converter DAC. Advantageously, instead of using two separated amplifiers for the two blocks, only one amplifier is shared between the S/H block and the first stage of the ADC.

For all the above mentioned types of switched capacitor ADCs, once a first digital estimation of the input ADC signal exists, an error signal or residue voltage is built which is proportional to the difference between the input signal $V_{inADC}$ and a voltage $V_{DAC}$ obtained by reconverting back into analog the current digital estimation of the input signal $V_{inADC}$.

The analog subtraction between the input signal $V_{inADC}$ and the signal $V_{DAC}$ output by the DAC can be obtained, for example, by a switched capacitor arrangement, although other techniques are also possible. In the example shown in FIG. 7, the input capacitor $C_{in}$ is pre-charged to $V_{inADC}$ during a first phase in which the switches 1 are closed, and the switch 2 is open.

In a second phase by inverting the state of switches 1 and 2, the node 85 at the right of $C_{in}$ (right electrode of $C_{in}$) is put in high impedance state, while the node 87 connected to the other electrode of $C_{in}$ (left side) is switched from $V_{inADC}$ to $V_{DAC}$, and as the voltage across the capacitor $C_{in}$ is kept constant (neglecting parasitic capacitor $C_p$), the voltage on the right electrode (node 85) would also change by $V_{DAC}-V_{inADC}$.

Since the voltage level on the right electrode (node 85) was initialized to 0 V, the error signal or residue will take value $V_{DAC}-V_{inADC}$. In fact, due to parasitic capacitor $C_p$, the voltage step applied on bottom electrode of $C_{in}$ will appear attenuated by a factor $C_{in}/(C_p+C_{in})$, slightly below 1, due to charge redistribution between $C_{in}$ and $C_p$, which can be a problem in the case wherein the residue must be evaluated precisely in the next stage, if $C_p$ is not precisely known.

FIG. 8 shows another example of switched-capacitor analogue difference input stage, suitable for the present invention. In this example the top electrode 85 of the input capacitor $C_{in}$ is tied to the virtual ground input of an amplifier. By this fact the circuit is not sensitive to the value of parasitic capacitor, as the voltage across $C_p$ is constant. During the first phase, the input capacitor $C_{in}$ is pre-charged to $V_{inADC}$ while the feedback capacitor $C_{fb}$ is discharged.

At the end of first phase, first the feedback switch 1 shorting $C_{fb}$ opens. From there on the total charge on virtual ground must be conserved. During the second phase, the bottom electrode of $C_{in}$ is switched by 2 from $V_{inADC}$ to $V_{DAC}$. The capacitor $C_{in}$ is charged to $V_{DAC}$, and the charge variation $C_{in} \cdot (V_{DAC}-V_{inADC})$ on the input capacitor $C_{in}$ will be taken up by the feedback capacitor $C_{fb}$. The output voltage of the amplifier will thus vary in the opposite direction and with a gain defined by the capacitor ratio $C_{in}/C_{fb}$.

Several other schematics allowing obtaining the difference between $V_{inADC}$ and $V_{DAC}$ through capacitive coupling are possible, and included in the scope of the present invention, in particular other schematics which allow to compensate the offset of the amplifiers, but they will not be detailed here.

The principle illustrated in FIG. 8 can be used within an ADC in order to realize the signal sampling together with the difference between input signal $V_{inADC}$ and feedback signal $V_{DAC}$. This solution is preferred when more a precise circuit gain is required, in particular in the following three conditions:

When a multi-bit quantization is performed: the signal $V_{DAC}$ must be evaluated more precisely in one step by comparing it simultaneously with several reference level When a voltage $V_{DAC}$ is generated for compensating the current error in a next stage, as for two or multi-stages ADC or pipeline ADC When the voltage $V_{DAC}$ must be amplified, typically with a $2^n$ gain, where n is the number of bits extracted from the ADC.

Figure 9:
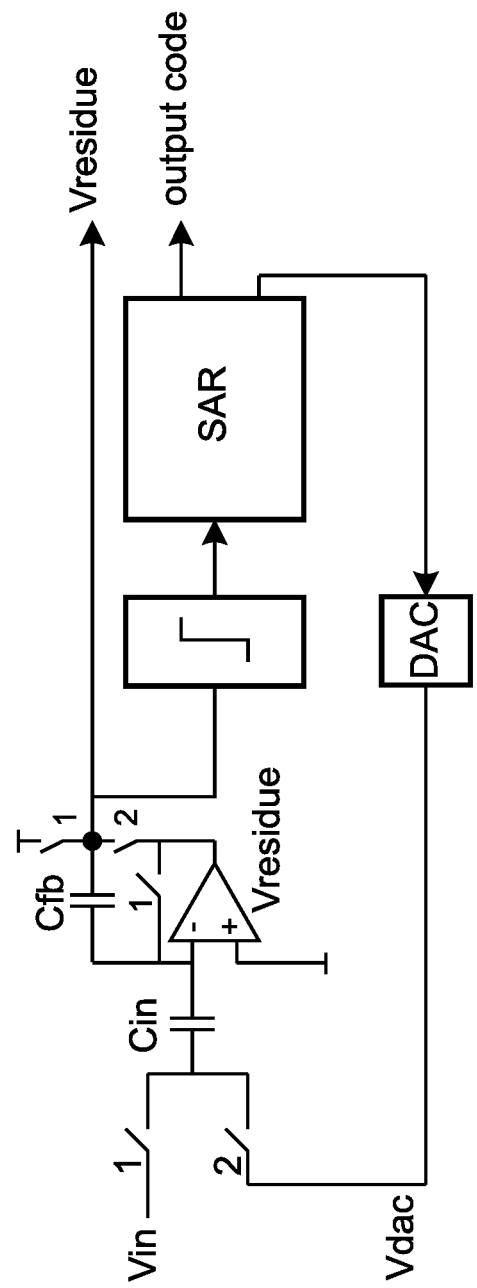
FIG. 9 shows one embodiment of a Successive Approximation ADC along with a CDS.

The solution illustrated in FIG. 8 can for example be used within a successive approximation ADC as illustrated in FIG. 9, if the residue must be amplified and outputted for compensation within a next ADC stage.

In the case of relatively fast ADC structures, i.e. successive approximation, pipeline, algorithmic ADC, based on switched capacitors, during the first phase (sampling) the input signal is sampled onto node 87 of the capacitor $C_{in}$, visible in FIG. 8, and then the node 87 of the capacitor $C_{in}$ is switched to a voltage $V_{DAC}$ representative of the estimated code in order to compute a residue. Thus the blocks sampler and holder S/H and the first stage of an switched capacitors ADC can easily be integrated in a single block.

Figure 22:
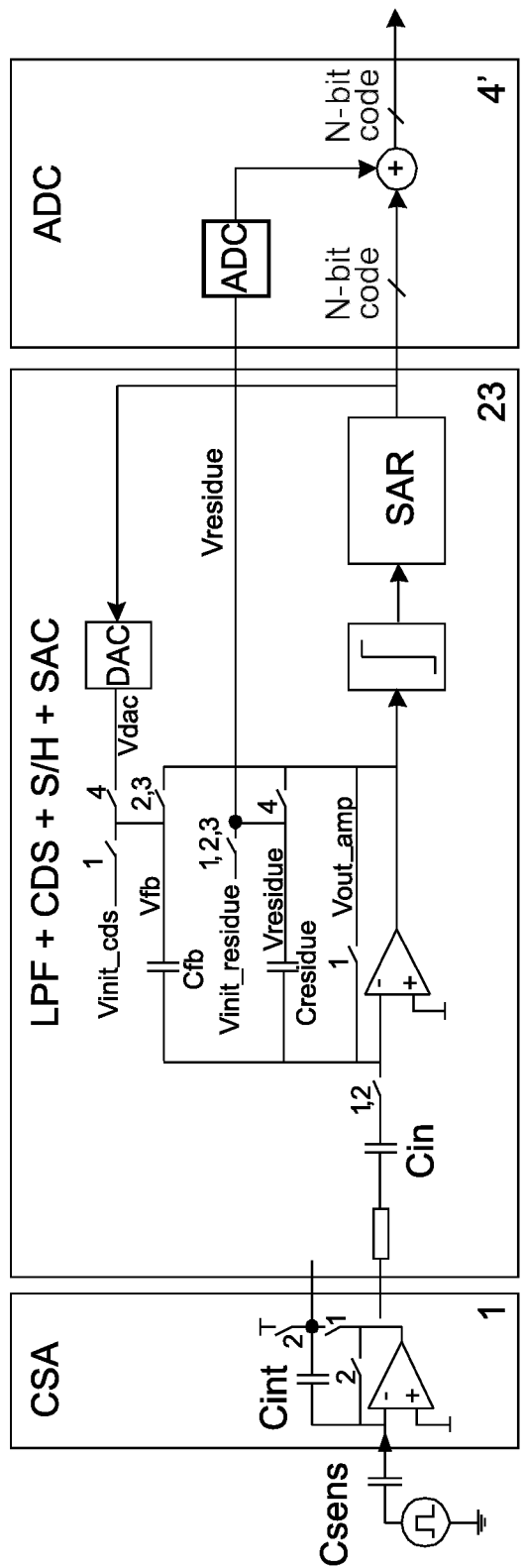
FIG. 22 shows one embodiment of a circuit according to the invention.

According to an independent aspect of the invention, it is possible to integrate in a single stage 23, shown for example in FIG. 22, the low pass filter LPF, the correlated double sampler CDS, the sampler and holder S/H and the first stage of a switched capacitors ADC, e.g a successive approximation ADC (SAC).

In one embodiment a capacitor is shared between the LPF+CDS and S/H+ADC blocks, performing the function of the feedback capacitor of the LPF+CDS block and the input capacitor of the S/H+ADC block.

In this embodiment the ADC input stage is based on capacitive coupling between two voltages, VinADC and VDAC, towards a high impedance node 85 as illustrated in FIG. 7.

Figure 10:
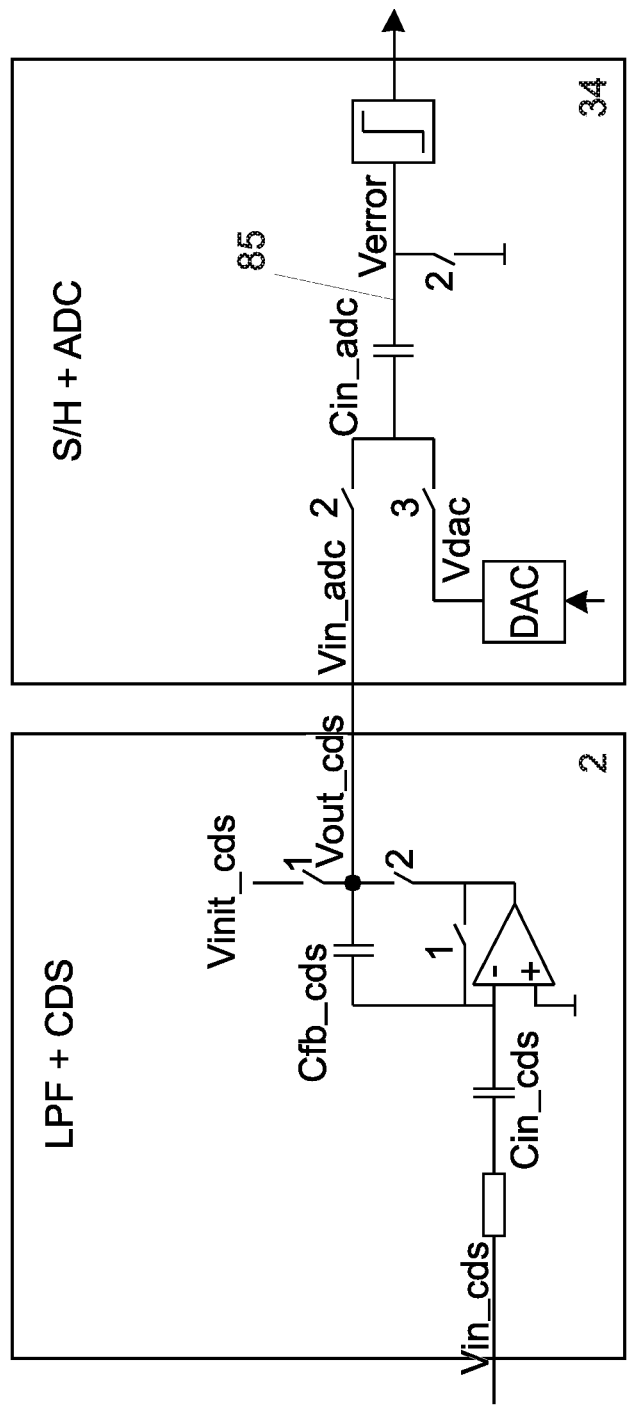
FIG. 10 shows one embodiment of a LPF+CDS block followed by a S/H+ADC block.
Figure 12:
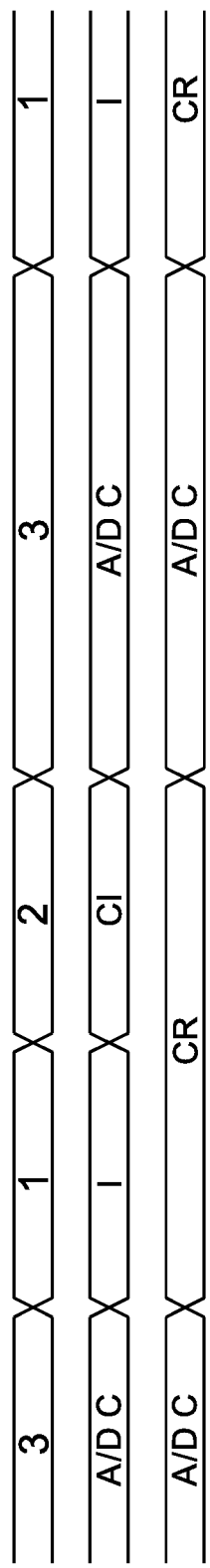
FIG. 12 shows one embodiment of the different phases for the operations of the circuit of FIG. 11 according to one embodiment of the invention.

FIG. 10 shows a LPF+CDS block 2 followed by a S/H+ADC 34, e.g. a sampling ADC stage. In this FIG. 10 these two blocks 2 and 34 are separates, i.e. are not integrated in a single block. The different phases for the operations of circuit of FIG. 10, illustrated in FIG. 12, are at least three:

initialization I (phase1)
charge integration CI (phase 2)
A/D conversion A/D C (phase 3).

The numbers 1, 2, 3 and 4 associated to the switches in FIGS. 10, 11, 13, 15, 16, 18, 20 and 22 indicate that the corresponding switches are closed during the phase with the same number and are opened in the other phases. If two numbers are associated with the same switch, for example "1, 2", they indicate that the corresponding switch is closed during the phase with the first and second number (in this case during the phase 1 and 2) and it is opened at the end of the phase with the second number (in this case at the end of the phase 2).

During the initialisation phase I (phase 1) the LPF+CDS block 2 is reset. By closing the switches 1 and by opening the switch 2 of the LPF+CDS block 2 during the phase 1, the input capacitor Cin_cds of FIG. 10, corresponding to the capacitor $C_{CDS}$ of FIG. 6, is pre-charged to a voltage Vin_cds1 and the feedback capacitor Cfb_cds is pre-charged to an initialization voltage Vinit_cds. The initialization voltage Vinit_cds in one embodiment can correspond to the analog ground. The block S/H+ADC 34 does not play any role during the initialisation phase 1.

During the charge integration CI phase (phase 2), the reset switches 1 of the LPF+CDS are opened and its switch 2 is closed, so that the total charge on the virtual ground node Vout_cds is kept constant. This total charge corresponds to the sum of the charges on the capacitor Cin_cds and the charges on the capacitor Cfb_cds.

If the input voltage Vin_cds changes from a first value Vin_cds1 to a second value Vin_cds2, since the total charge on the virtual ground node Vout_cds is kept constant, the corresponding charge variation on the capacitor Cin_cds implies an opposite charge variation on the capacitor Cfb_cds, so that the output voltage of the CDS Vout_cds at the end of the phase 2 is $$V\text{out\_cds} = V\text{init\_cds} - \frac{\text{Cin\_cds}}{\text{Cfb\_cds}}(V\text{in\_cds2} - V\text{in\_cds1})$$

At the end of the phase 2, this voltage Vout_cds is copied to the input capacitor Cin_adc of the S/H+ADC block 34, i.e. Vout_cds=Vin_adc. In other words $$V\text{in\_adc} = V\text{init\_cds} - \frac{\text{Cin\_cds}}{\text{Cfb\_cds}}(V\text{in\_cds2} - V\text{in\_cds1})$$

During this phase 2, the error voltage Verror, i.e. the voltage at the node 85 at the right of the capacitor Cin_adc, is forced to be constant, for example 0 V, by closing the switch 2 at the right of the capacitor Cin_adc of the block S/H+ADC 34.

During the phase 3, Cin_adc is switched from Vin_adc to Vdac, by opening the switch 2 at the left of the capacitor Cin_adc and by closing the switch 3 of the block S/H+ADC 34 such that the error voltage Verror at the node 85 is equal to $$V\text{error}=V\text{dac}-V\text{in\_adc}$$

Figure 11:
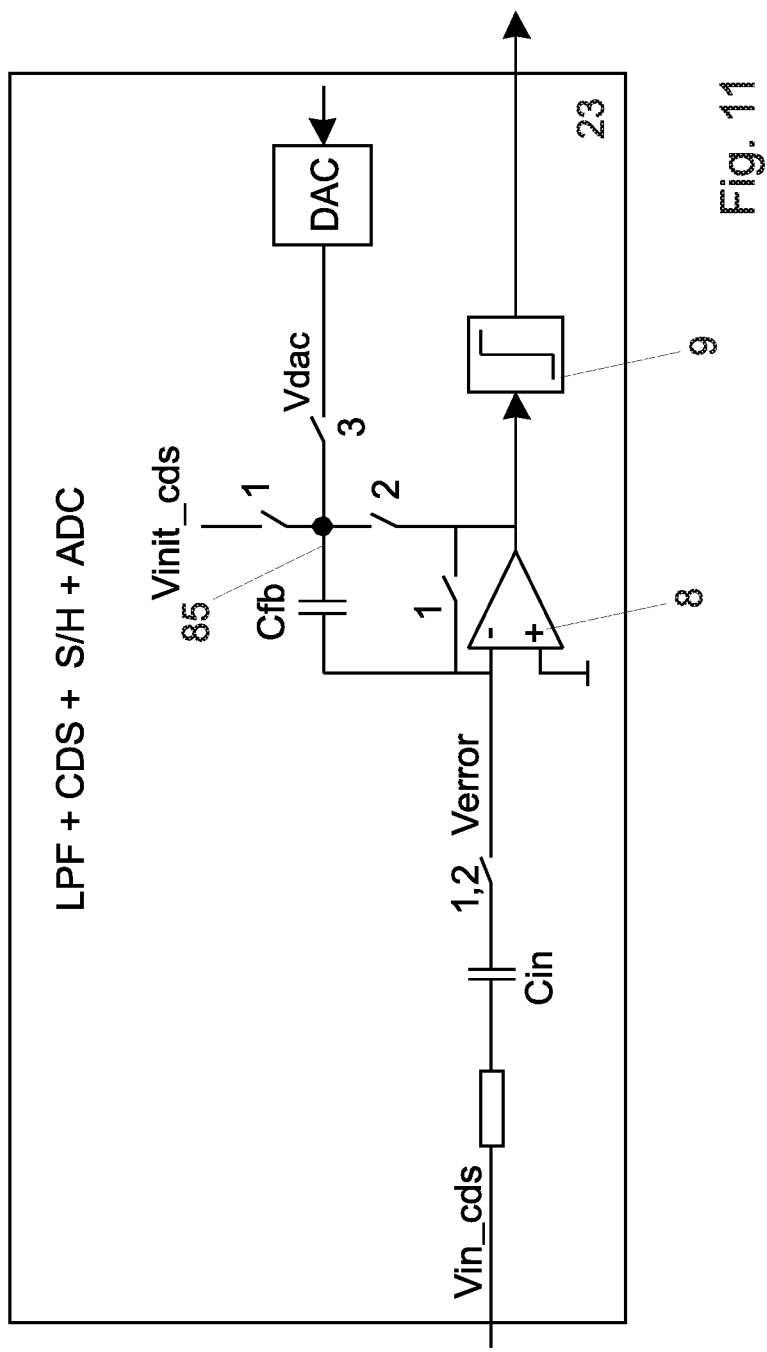
FIG. 11 shows one embodiment of a circuit according to the invention.

The two blocks LPF+CDS 2 and S/H+ADC 34 can be advantageously integrated in a single block as illustrated in FIG. 11. In this case the phases 1 and 2 are identical to the solution of FIG. 10.

During the phase 1 or initialisation phase I:
the input capacitor Cin is pre-charged to a voltage of a first sample Vin_cds1 by closing the input switch 1,2
the amplifier 8 is reset by closing the reset switch 1
the feedback capacitor Cfb is pre-charged to an initialisation voltage Vinit_cds by closing the pre-charging switch 1

During the phase 2 or charge integration phase CI
the voltage of a first sample Vin_cds1 on the input capacitor Cin changes into a voltage of a second sample Vin_cds2
the input switch 1, 2 remains closed, the reset switch 1 and the pre-charging switch 1 are opened
the feedback capacitor Cfb is switched in feedback of the amplifier 8 by closing the feedback switch 2 in order to generate a first voltage to be converted (Vin_adc), proportional to the difference between the voltage of the second sample Vin_cds2 and the voltage of the first sample Vin_cds1.

In other words, at the end of the phase 2 the input capacitor Cin is disconnected from the amplifier 8 by opening the input switch 1,2. Instead of copying the voltage across a capacitor (Cfb_cds) into another capacitor (Cin_adc) of the ADC, the input of which is switched from a voltage (Vin_adc) to another (Vdac) as in the previous case (FIG. 10), in this case during the phase 3 the node 85 at the right of the capacitor Cfb is directly switched towards Vdac, so that the voltage $$V\text{error}=V\text{dac}-V\text{in\_adc}$$

is directly applied at the negative input of the amplifier 8, which in phase 3 is in open loop, because Cfb is now forced to Vdac. In this case Vin_adc indicates the voltage to be converted, which is proportional to the difference between Vin_cds2 and Vin_cds1. The amplifier 8 in open loop now can be used as the first pre-amplifier stage for the comparator 9, with the advantages that the offset of this first stage will then be compensated and that the gain of the amplifier 8 will be achieved in front of the comparator 9, reducing the sensitivity to its offset.

One advantage of the structure of FIG. 11 is that the copy of the voltage from feedback capacitor Cfb of the LPF+CDS block to input capacitor Cin_adc of the S/H+ADC block is avoided, and thus also the power consumption required for this operation as well as the corresponding noise involved by this operation.

In other words the integration of the low-pass filter LPF, the correlated double sampler CDS, the sample and holder S/H and the first stage of an ADC, for example a SAC, in a single block allows in this case to share the capacitor Cfb of FIG. 11 between the two blocks LPF+CDS and S/H+ADC of FIG. 10, avoiding the use of two capacitors Cfb_cds and Cin_adc of FIG. 10 and then reducing the number of elements of the integrated block 23 compared to the number of elements required in order to build the two separated blocks of FIG. 10 without any shared element, allowing to reduce the noise level, the current consumption and the required area on a silicon slice. The circuit of FIG. 11 employs also a reduced number of switches.

The different phases for the operation of circuits of FIG. 10 and FIG. 11 are illustrated in FIG. 12.

The charge reading phase (CR) during which two samples are taken from the CSA output corresponds to phases 1 and 2. In this period the input capacitor Cin of FIG. 11 is tied to the amplifier 8. The A/D conversion A/D C is inserted between two charge reading phases CR and can limit the frequency at which the different row of the multi-touch device can be read, i.e. the line frequency.

Figure 13:
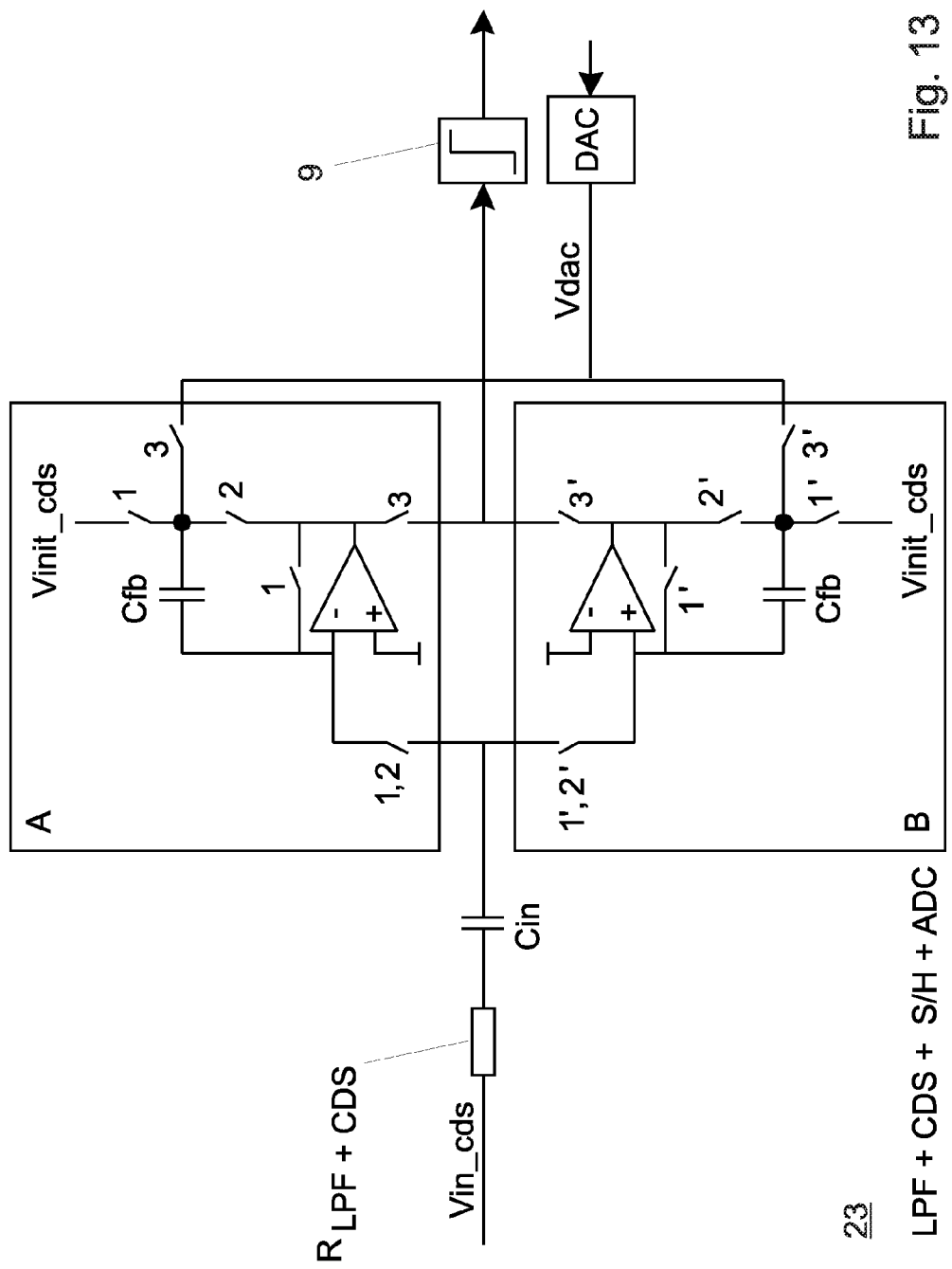
FIG. 13 shows another possible embodiment of a circuit according to the invention, in order to optimize the read-out frequency.
Figure 14:
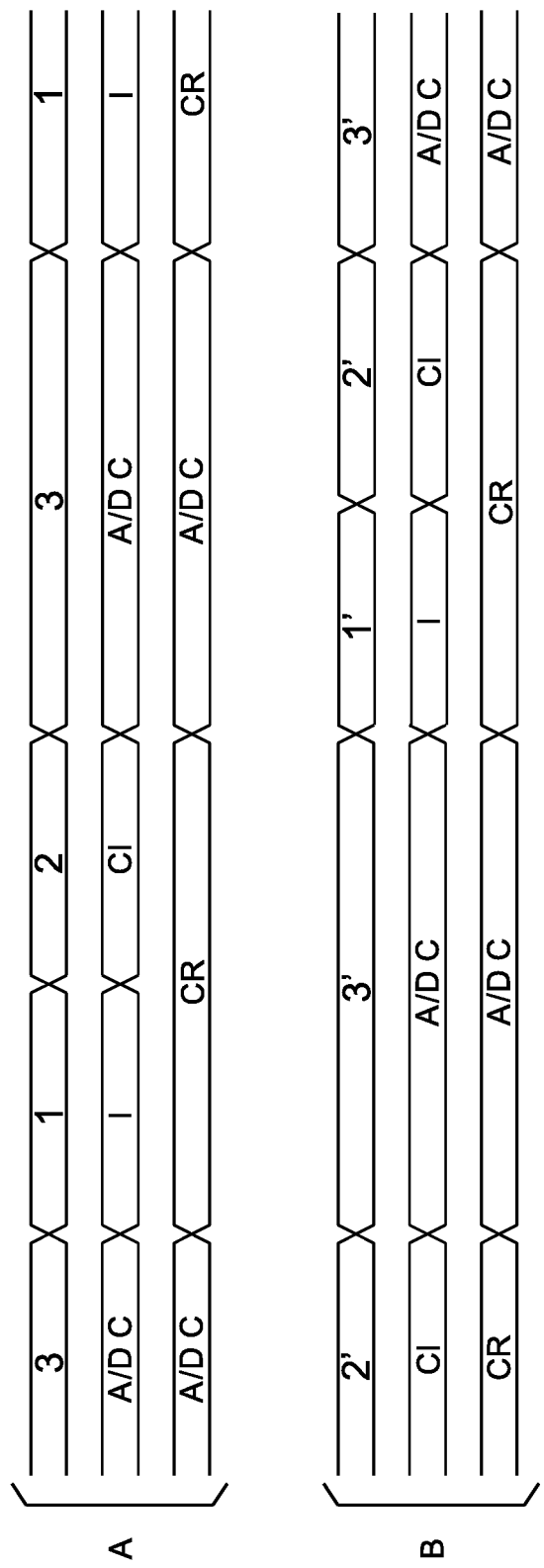
FIG. 14 shows one embodiment of the different phases for the operations of the circuit of FIG. 13 according to one embodiment of the invention.

In order to optimize the line frequency, two switched capacitor sub-blocks A, B, shown in FIG. 13, operated in tandem can be advantageously used. In this context the expression "operated in tandem" means that one sub-block performs the charge reading while the other performs the A/D conversion. FIG. 14 shows the different phases for the operations of the circuit of FIG. 13.

The filter of FIG. 13, comprising the resistor $R_{LPF+CDS}$ and the capacitor Cin, does not need to be duplicated for the two switched capacitor sub-blocks A, B because it is only connected to one sub-block at a time—either the upper (A) or the lower one (B)—the one which is in charge reading mode. Similarly, the comparator 9, which performs the function of a coarse ADC, and the DAC in the feedback path do not need to be duplicated because they are only used by the switched capacitor sub-block that is in A/D conversion mode.

In another embodiment more than two sub-blocks operated in tandem can be used. Two sub-blocks are suitable if the charge reading and A/D conversion have the same duration. If A/D conversion phase is N times longer than charge reading phase, then N+1 sub-blocks operated in tandem can be used, one being in the charge reading mode while the N others performing ADC conversion, the roles of the sub-blocks being cyclically exchanged.

In another embodiment the ADC input stage is based on capacitive coupling between VinADC and VDAC towards an inverting amplifier as illustrated in FIG. 8.

In this embodiment wherein the S/H+ADC block comprises an amplifier, not only a capacitor, performing the function of the feedback capacitor of the LPF+CDS block and the input capacitor of the S/H+ADC block, but also an amplifier, integrating the function of the amplifiers of the LPF+CDS and S/H+ADC blocks, are shared between the two blocks.

Figure 15:
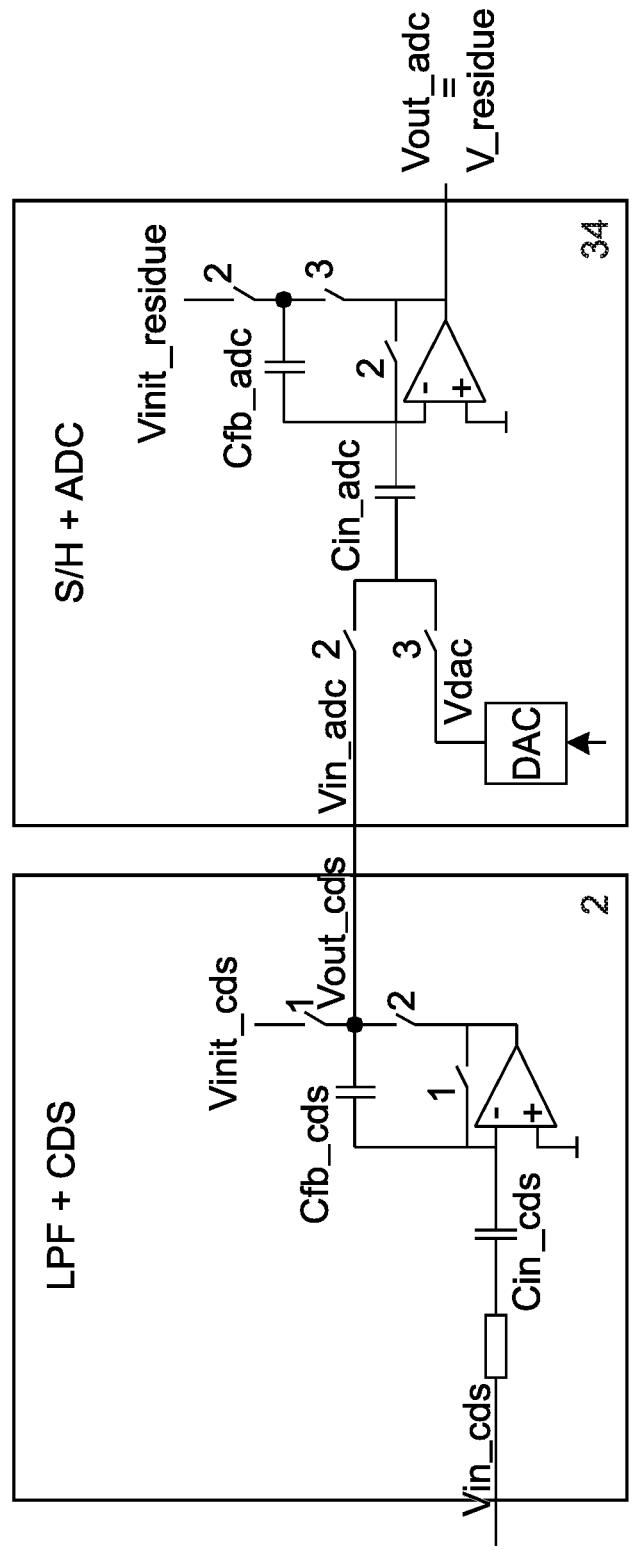
FIG. 15 shows another embodiment of a LPF+CDS block followed by a S/H+ADC block.

FIG. 15 shows a LPF+CDS 2 followed by a S/H+ADC 34, i.e. a sampling ADC stage. These two blocks 2 and 34 then are not integrated in a same block. This circuit needs at least three operation phases. The operations of LPF+CDS block 2 during the phases 1 and 2 are identical as for the circuit of FIG. 10. During the phase 2, the LPF+CDS output voltage Vout_cds is copied to the input capacitor Cin_adc of the S/H+ADC 34, and the feedback capacitor Cfb_adc of S/H+ADC is initialized to Vinit_residue by closing the switch 2 at its right side. At the end of phase 2, the switch 2 in the feedback path of the amplifier of the S/H+ADC block is opened, and the input capacitor Cin_adc is switched to Vdac while the Cfb_adc capacitor is switched in feedback of the amplifier of the block S/H+ADC, both operations being performed by closing the switches 3.

The charge variation on the input capacitor Cin_adc is taken from the feedback capacitor Cfb_adc, so that the output voltage Vout_adc is $$V\text{out\_adc} = V\text{residue} = V\text{init\_residue} - \frac{C\text{in\_adc}}{C\text{fb\_adc}}(Vdac - V\text{in\_adc})$$

As FIG. 15 shows, the Vin_adc is equal to Vout_cds.

Figure 16:
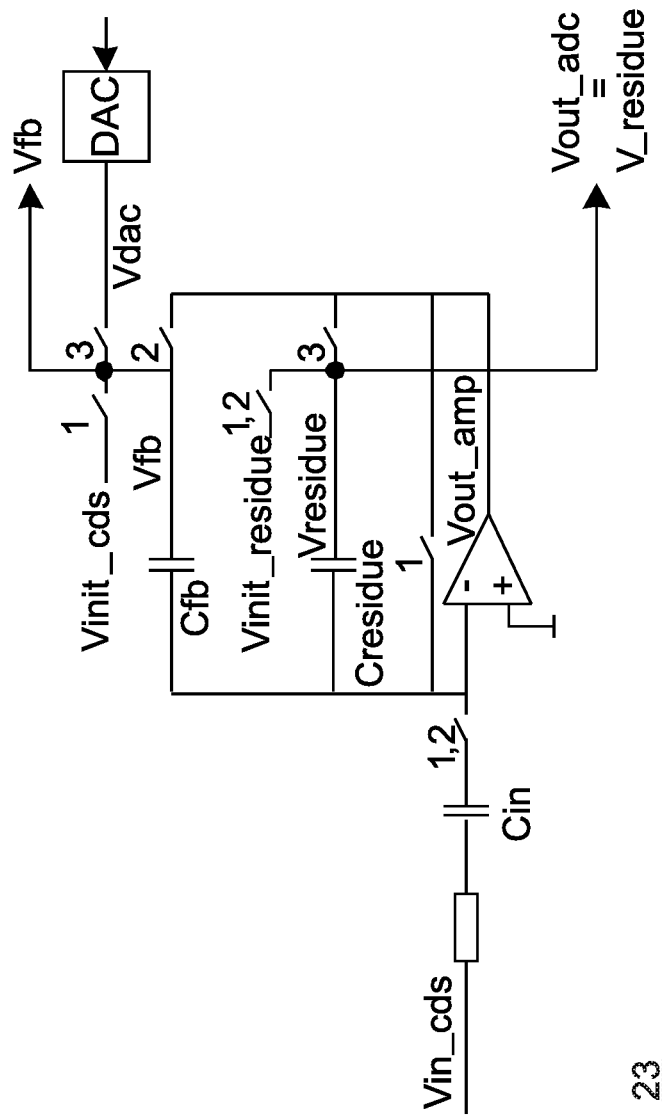
FIG. 16 shows another embodiment of a circuit according to the invention.

Also in this embodiment the two blocks LPF+CDS 2 and S/H+ADC 34 can be advantageously integrated in a single block as illustrated in FIG. 16, wherein Cin plays the role of Cin_cds of FIG. 15, Cfb the role of both Cfb_cds and Cin_adc, and Cresidue plays the role of Cfb_adc. Since Cfb plays the role of both Cfb_cds and Cin_adc, and since the integrated block 23 contains only one amplifier instead of the two amplifiers of FIG. 15, the number of elements of the integrated block 23 is lower than the number of elements that are required for the separated blocks 2 and 34, allowing to reduce the noise level, the current consumption and the required area on a silicon slice.

During phases 1 and 2, the operations are similar as for the circuit of FIG. 15 except that there is now the capacitor Cresidue tied between the virtual ground of the amplifier and Vinit_residue during phases 1 and 2. The different phases are illustrated in FIGS. 17A to 17C.

Figure 17A:
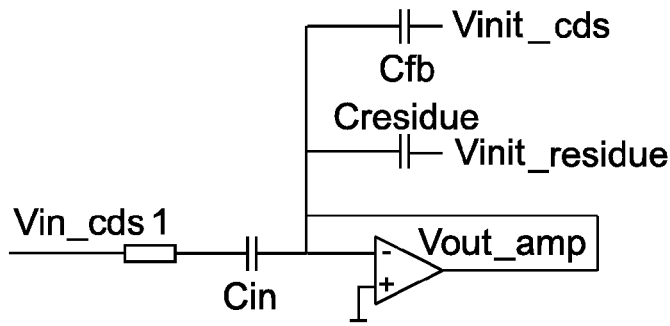
FIG. 17A to 17C show the operations of the circuit of FIG. 16 in three different phases.

During the phase 1 (initialization), shown in FIG. 17A, the amplifier is reset by shortening the virtual ground and its output, while the input capacitor Cin is pre-charged to Vin_cds=Vin_cds1 (first sample taken from the CSA), Cfb is pre-charged to an initial voltage Vinit_cds and Cresidue to Vinit_residue by closing the switch 1,2 (fourth pre-charging switch).

Figure 17B:
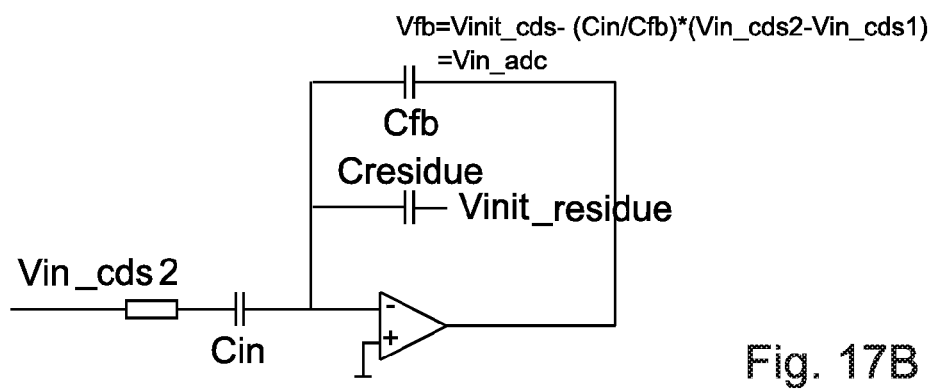
Figure 17C:
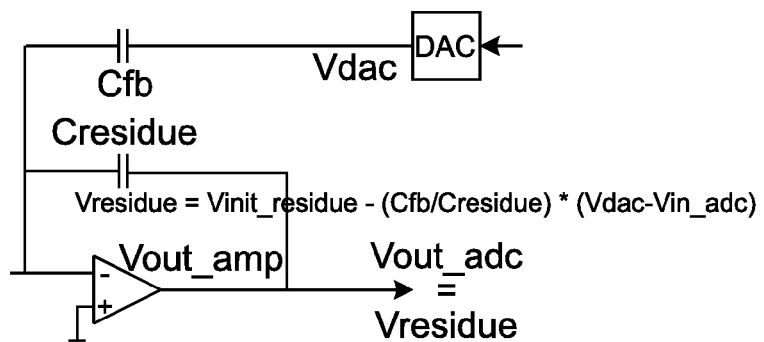

At the end of phase 1, i.e., at phase 2 illustrated in FIG. 17B, the switch 1 between the input and the output of the amplifier is opened, which corresponds to the first sampling of the correlated double sampling, and consequently the total charges on Cin, Cfb and Cresidue are kept constant. Once the input switch 1,2 is opened, Cfb is switched in feedback of the amplifier, while the voltage on Cin gradually changes from Vin_cds1 to Vin_cds2. The voltage on Cresidue remains unchanged, set to Vinit_residue, so that the charge on Cresidue remains constant. Hence the charge variation on Cin is taken from Cfb, and the output voltage on the right node of the capacitor Cfb is given by $$Vfb = V\text{init\_cds} - \frac{Cin}{Cfb}(\text{Vin\_cds2} - \text{Vin\_cds1})$$

The difference between this voltage Vfb and its initialization value Vinit_cds is then proportional to (Vin_cds2−Vin_cds1) and thus to the charge integrated by the charge integrator CSA. This voltage will then act as the input voltage Vin_adc of the ADC for the phase 3 illustrated in FIG. 17C.

At the end of phase 2, the input capacitor Cin is disconnected, which corresponds to the second sampling of the correlated double sampling. From there on the total charge on Cfb and Cresidue is kept constant. Cresidue is then put in feedback by closing the switch 3 (fifth switch) at its right side, while Cfb if forced to Vdac, so that the charge variation on Cfb is taken from Cresidue. The value Vresidue of the voltage on Cresidue in feedback is then $$V\text{residue} = V\text{init\_residue} - \frac{Cfb}{C\text{residue}}(Vdac - V\text{in\_adc})$$

The residue Vresidue is thus amplified by the ratio Cfb/Cresidue and can be used to refine the signal estimation within the same stage by successive approximation or algorithmic ADC conversion, or within a next ADC stage in case of pipeline ADC.

For a pipeline ADC, the node used as input for the coarse quantization in order to pilot the DAC in feedback is directly the node of the ADC input voltage Vfb=Vin_adc. Vin_adc can be compared with different levels, simultaneously or sequentially.

For a successive approximation ADC, however, the quantization is performed on the residue Vresidue, and the result used to update the successive approximation register and the feedback DAC.

In another embodiment a first coarse quantization is performed before generating the residue, in order to fasten the extraction of the first bits by reducing slew rate requirements. The first quantization can then be performed based on Vfb while the fine quantization can be performed on Vresidue.

If the first quantization is performed by comparing Vfb simultaneously with different reference levels (flash ADC conversion), it can occur directly at the end of phase 2. However, if the coarse quantization is performed in several steps (not instantaneous), it cannot be performed during phase 2 because the quantization may only be performed once all the charges have been integrated.

Figure 18:
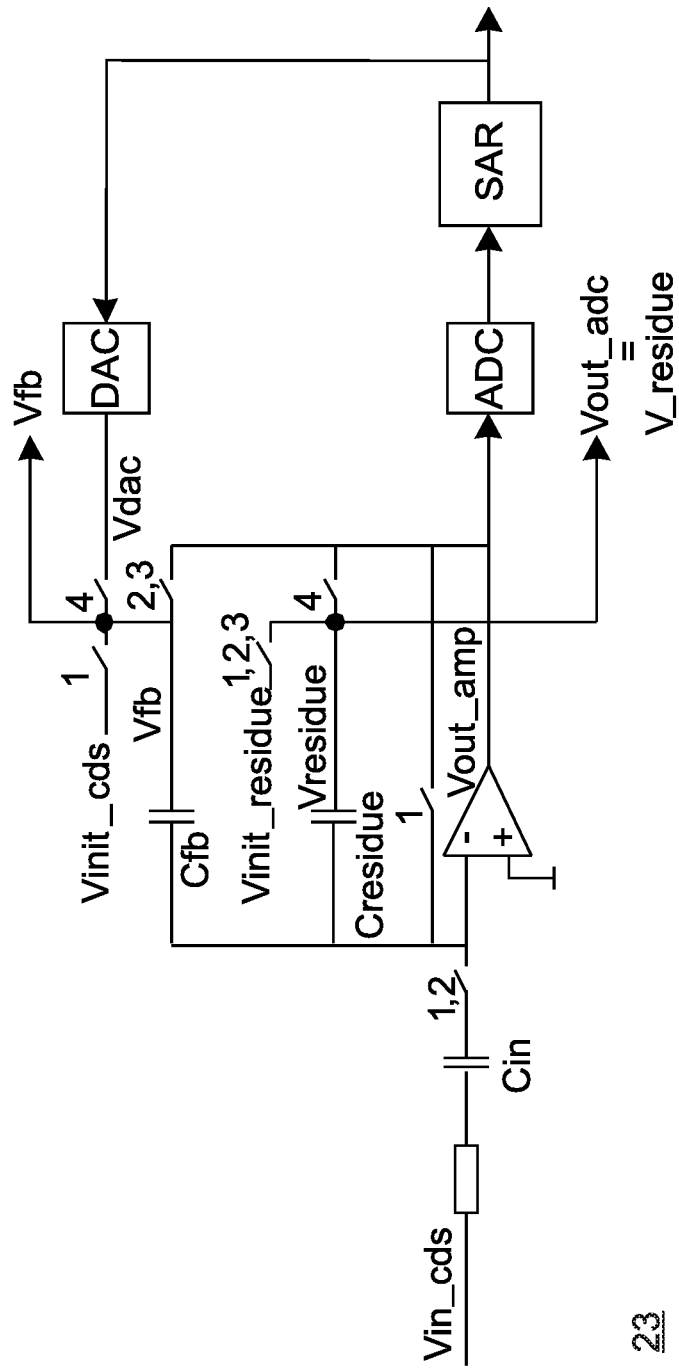
FIG. 18 shows another embodiment of a circuit having four operations' phases.
Figure 19:
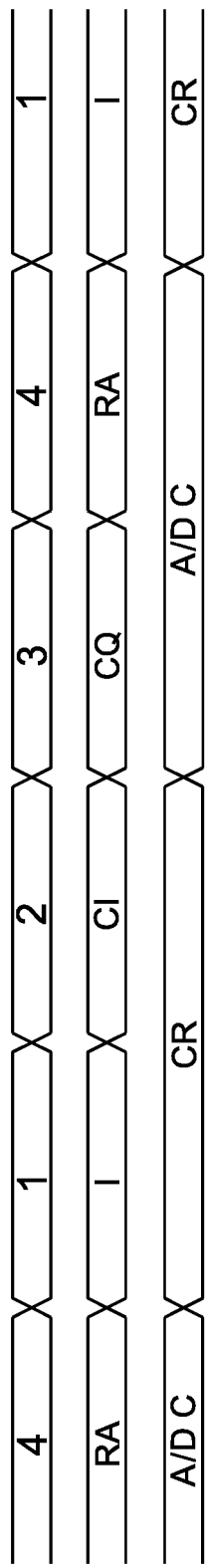
FIG. 19 shows one embodiment of the four different phases for the operations of the circuit of FIG. 18 according to one embodiment of the invention.

A possible embodiment splits the A/D conversion in two phases, i.e. a coarse quantization and a fine quantization or residue amplification, leading to a 4-phases circuit, as illustrated in FIGS. 18 and 19. FIG. 19 shows the four different phases for the operations of the circuit of FIG. 18. The difference with the circuit of FIG. 16 is that, after Cin has been disconnected, Cfb still remains in feedback during phase 3 for coarse quantization. Cresidue is put in feedback and Cfb forced to Vdac only in phase 4, which corresponds to phase 3 of the circuit of FIG. 16.

The circuit of FIG. 18 is thus more general because the phase 3 of coarse quantization may optionally be avoided, leading than to the case of the circuit of FIG. 16. Also the successive approximation register can be reduced to a simple latch in case of a pipeline stage. In this case, Vfb is quantized in the phase 3 and the result latched within phase 4 for DAC conversion, residue generation and amplification.

Figure 20:
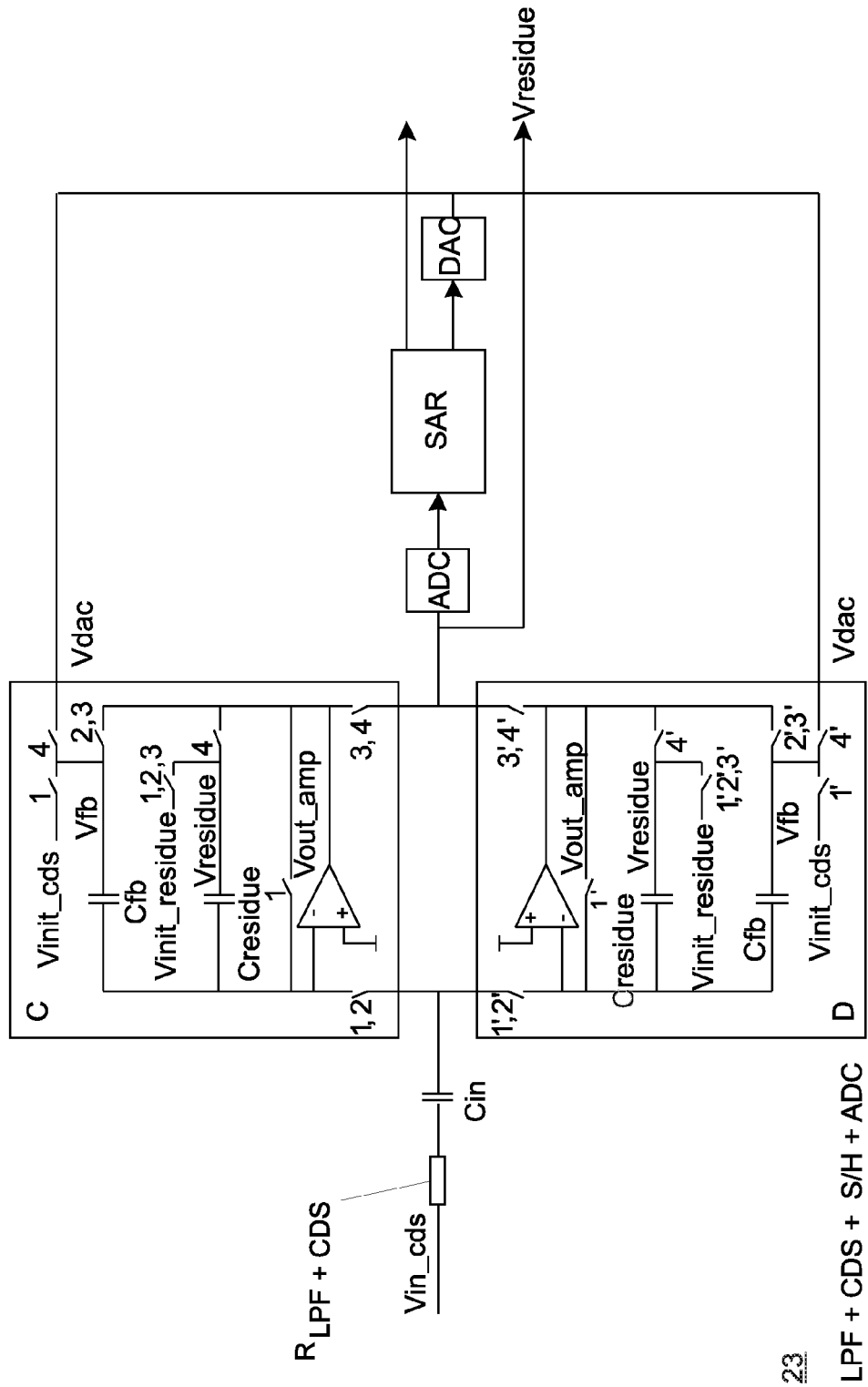
FIG. 20 shows another possible embodiment of the circuit according to the invention, in order to optimize the read-out circuit.
Figure 21:
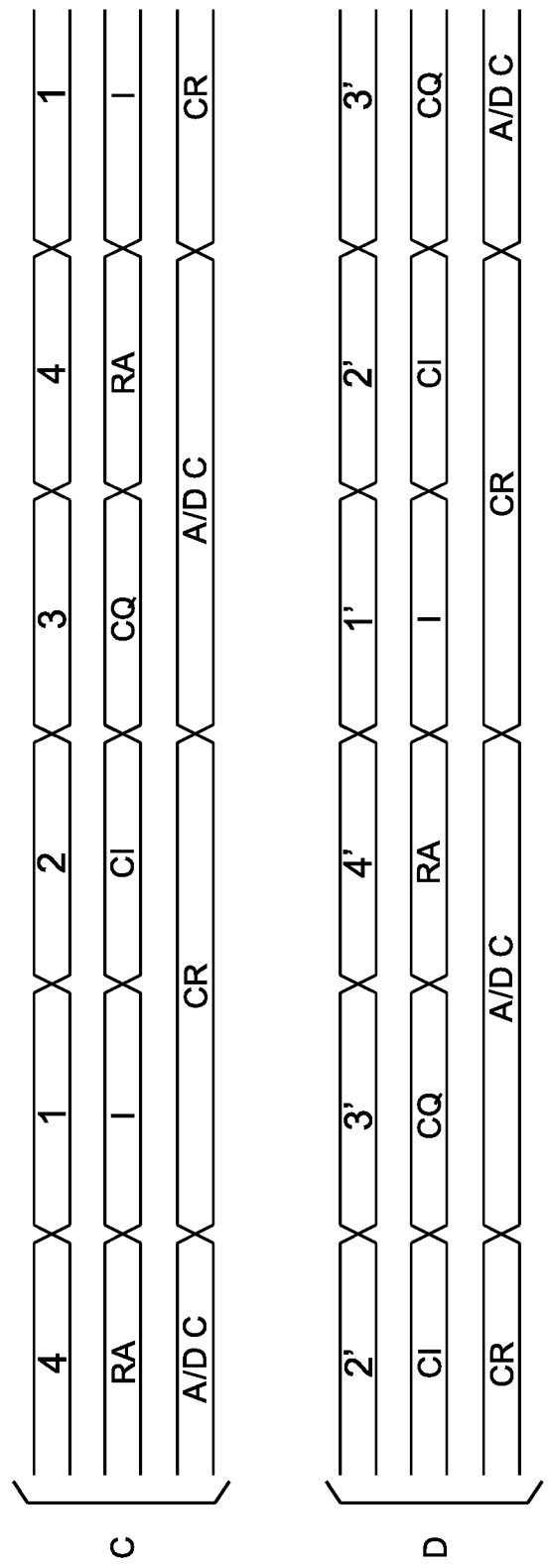
FIG. 21 shows one embodiment of the four different phases for the operations of the circuit of FIG. 20 according to one embodiment of the invention.

In order to optimize the line frequency, in one embodiment two switched capacitor sub-blocks C and D operated in tandem can be used, such that one performs the charge reading while the other performs the A/D conversion, as illustrated in FIGS. 20 and 21. The filter comprising the resistor $R_{LPF+CDS}$ and the capacitor Cin does not need to be duplicated because it is only connected to one switched capacitor sub-block at a time, either the upper or the lower one, that one which is in charge reading mode. Similarly, the comparator or coarse ADC, successive approximation register and the DAC in the feedback path do not need to be duplicated because they are only used by the sub-clock that is in A/D conversion.

In the case wherein the ADC conversion is N times longer than charge reading phase, more than two sub-blocks operated in tandem can be used, and the considerations made about FIG. 13 are still valid.

FIG. 22 illustrates one possible embodiment of a circuit comprising a charge sensing amplifier CSA 1, a single block 23 which integrated the low pass filter LPF, the correlated double sampler CDS, the sampler and holder S/H and the first stage (SAC) of a multi-stage ADC. The single block 23 is the same of FIG. 18.

The solution shown in FIG. 22 can be implemented for each channel of a multi touch device: in this manner, it is possible to achieve a good conversion speed for the considered touch applications (up to 100 KHz) with a relatively high resolution in each channel (up to 16-bit) and a low differential and spatial non-linearity. The differential non-linearity is defined as a measure describing the deviation between two analog values corresponding to adjacent input digital values. The ADC—which is present in each channel—is formed by a first stage, which is integrated with the LPF, the CDS and the S/H in the block 23, followed by a cascade of M-stages converting the residue of the previous stages.

Figure 23:
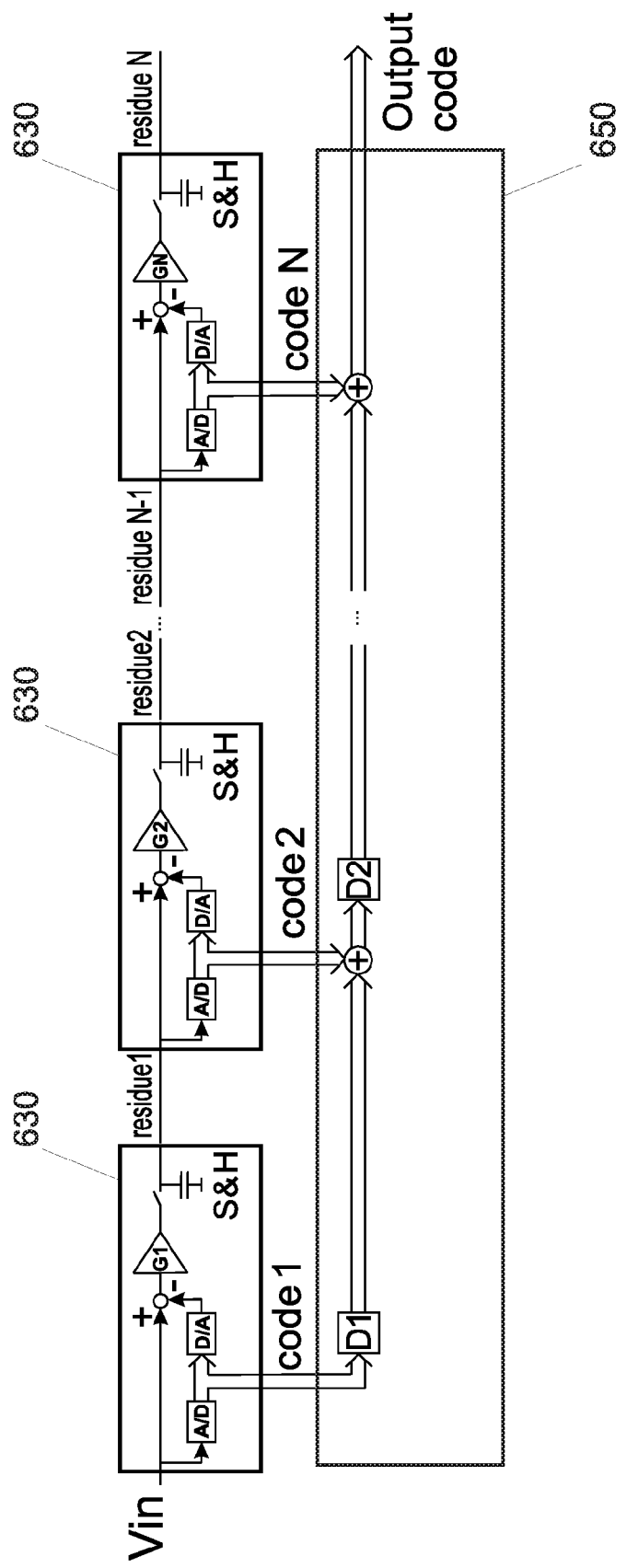
FIG. 23 shows schematically a pipeline ADC including successive approximation stages.

Referring now to FIG. 23, the circuit of the invention, as discussed, can include a multistage ADC or multistep ADC in which the conversion is performed in several steps. It is made of a cascade of several stages 630. In each stage, the input signal is sampled and converted into a digital signal by a coarse ADC (which can also be reduced to a simple comparator). The obtained code is then reconverted back into analogue by a digital to analog converter D/A and the DAC output is subtracted from the input signal. This difference, which is an analogue representation of the quantization error performed in the current stage, is then eventually amplified and finally stored in a capacitor by a sample and hold circuit in order to produce a residue signal which can be further processed. This residue signal is then fed to the next stage so that this one can give a digital estimate of the error performed in the previous stage. The quantization error related to each stage may then be compensated for by feeding the residue to the next stage, excepted for the last stage. The residue of the last stage is thus an image of the overall conversion error.

The output codes from the different stages are then delayed in order to compensate for the propagation time across the cascade, and combined together in an output combinatory 650 in order to obtain a high resolution output code in which all the internal residue errors are compensated, at least ideally. The combination consists into a properly weighted sum of the outputs of the codes from all the stages. The number of bits of ADC and DAC within each stage can be different and the quantization within each stage can also be reduced to a simple comparison.

In the representation of FIG. 23, each step of the conversion algorithm is performed by a dedicated stage. In this case, it is called pipeline ADC. But other possibilities exist, and are also enclosed in the scope of the invention.

Figure 24:
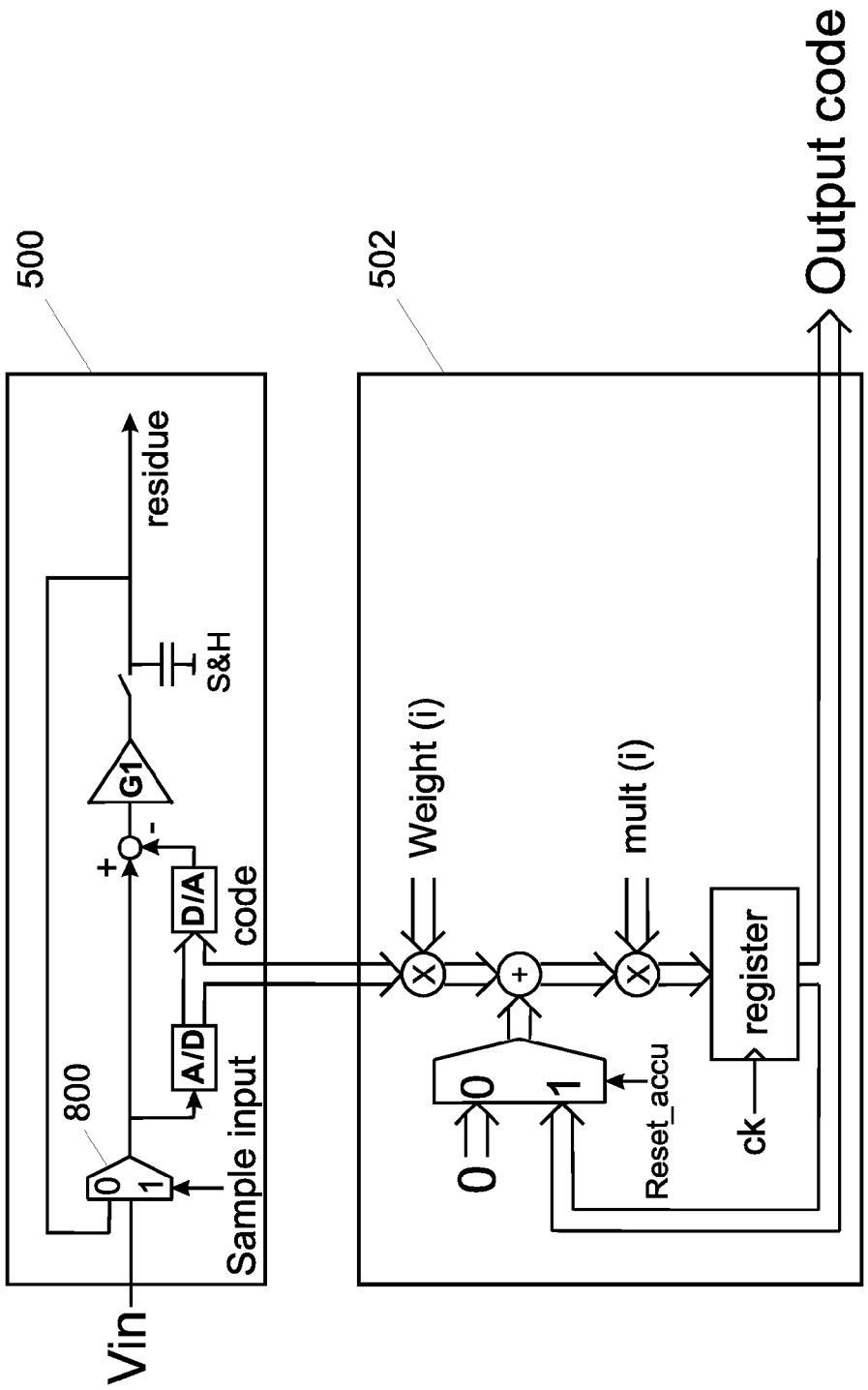
FIG. 24 shows schematically an algorithmic ADC including one successive approximation stage.

When the different steps are performed by the same analogue stage, sequentially in time, the converter is called an algorithmic ADC, an example being illustrated in FIG. 24. The structure is similar to that of a pipeline stage except that a multiplexer 800 is added at the input of the block so that the effective input of the block is either the real input of the block when the input signal is sampled, or the residue of the stage calculated at the previous step, in order to refine the signal estimation.

The different bits or codes obtained successively in the different steps must then be accumulated properly with proper weights in a digital accumulator 502. As these weights generally correspond to powers of 2, the corresponding digital multiplications generally reduce to simple shifts. In fact, the multiplication by the weight in front of the accumulation loop is generally replaced by a multiplication within the accumulation loop. The multiplication factor in this case corresponds to the ratio of weights of two successive codes. The reference 500 in FIG. 24 designates the analog part of the algorithmic ADC.

Figure 25:
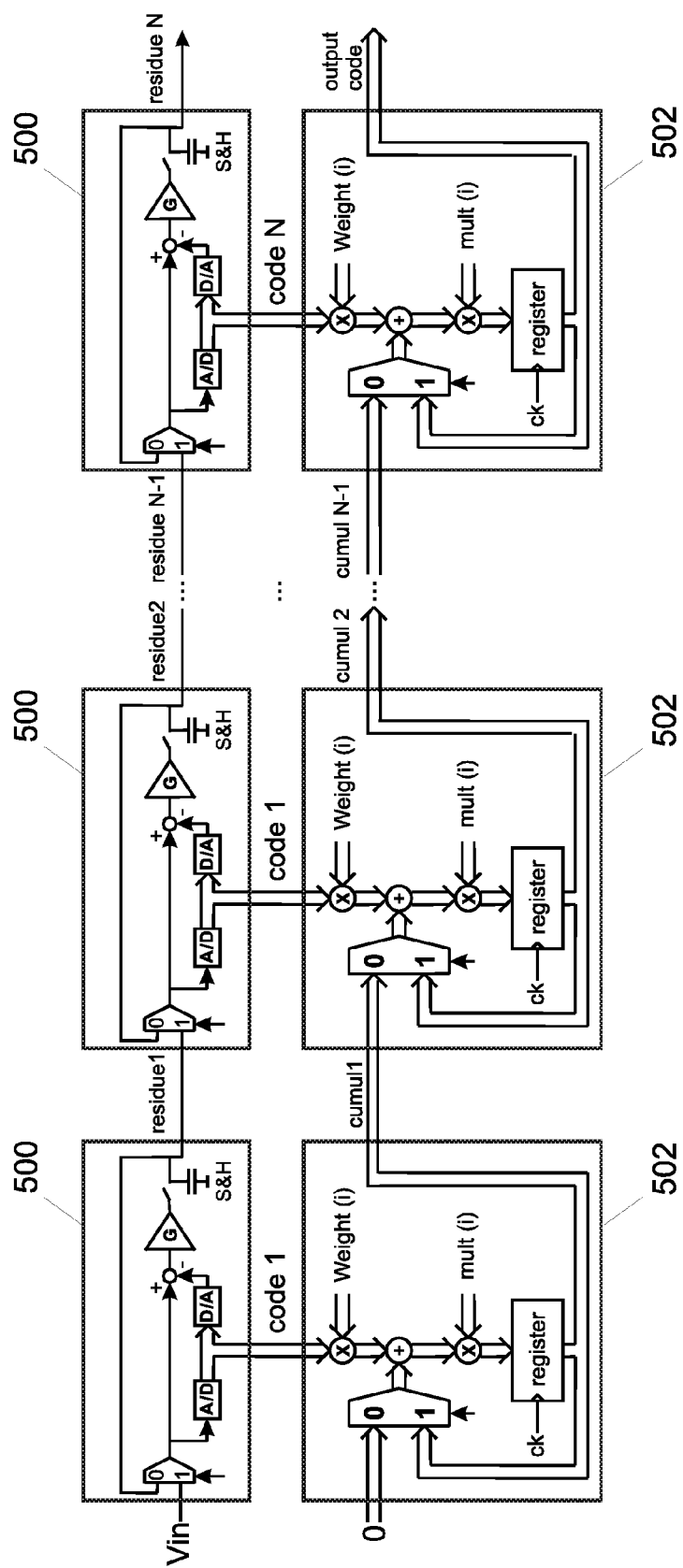
FIG. 25 shows a combined ADC architecture including successive approximation stages.

Finally, both approaches can be combined by cascading two or more stages, each stage being an algorithmic ADC (FIG. 25). In this case, each stage performs several steps of the conversion and then passes the residue to the next stage for processing of the next steps. A similar process occurs in the digital part. A first accumulator accumulates the bits for the first stage and then transfers the result to the accumulator of the second stage, and so on.

Figure 26:
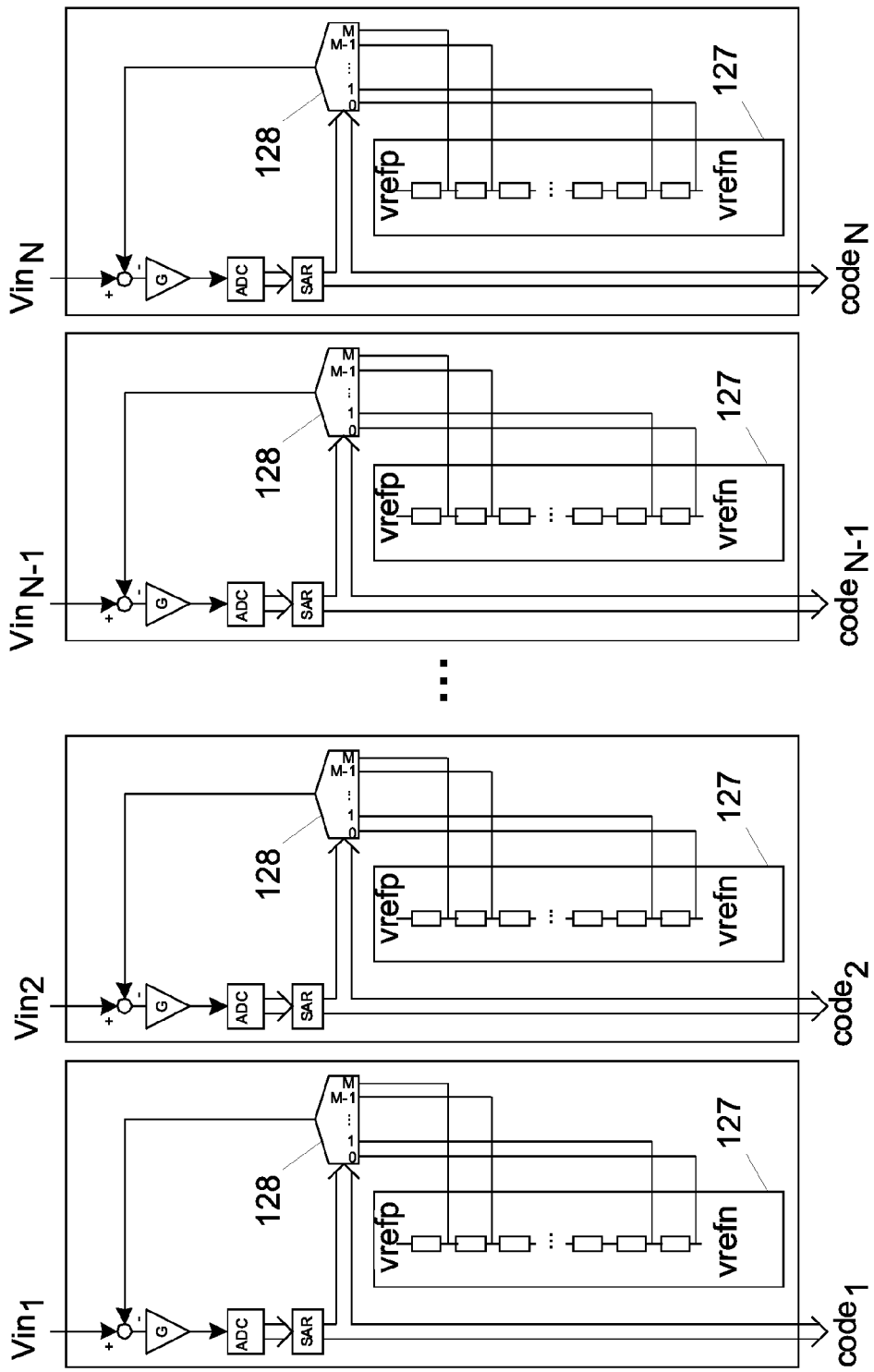
FIG. 26 shows N parallel channels incorporating each a successive approximation ADC with a resistive DAC in feedback consisting into a resistive divider or ladder and a multiplexer.

The spatial and differential non-linearity can be reduced if N successive approximation ADCs of N channels are in parallel. In a known implementation of the ADC, the feedback DAC in each channel is realized by selecting tabs from a resistive divider or ladder 127 according to FIG. 26. Each channel thus would include its own resistive divider or ladder 127 and multiplexer 128.

The resistive DAC in feedback of each DAC has a thermometric principle and thus intrinsically guarantees a monotonic conversion and a very low differential non-linearity. The integral linearity, i.e. the measure of the ADC deviation from an ideal behaviour, is not improved by the thermometric principle, it only depends on the matching between resistors, in particular on the matching between resistors in the upper part of the ladder 127 with respect to those in the lower part. However, the integral non-linearity is generally not a problem because it is a very smooth non linearity, without discontinuities, and thus its effect in onto an image in the application is simply to very gradually change the grey scale.

The problem is however that the integral non-linearity error is different for each channel. By this fact, according to the input signal level along the line, differences between adjacent channels may appear, causing variations of the sensibility between adjacent columns. This effect is called spatial non-linearity, which is the non-linearity on the difference between two adjacent channels, after compensation of gain and offset errors of the different channels.

Advantageously a common resistive divider is shared between all channels in order to solve this problem of spatial non-linearity.

Figure 27:
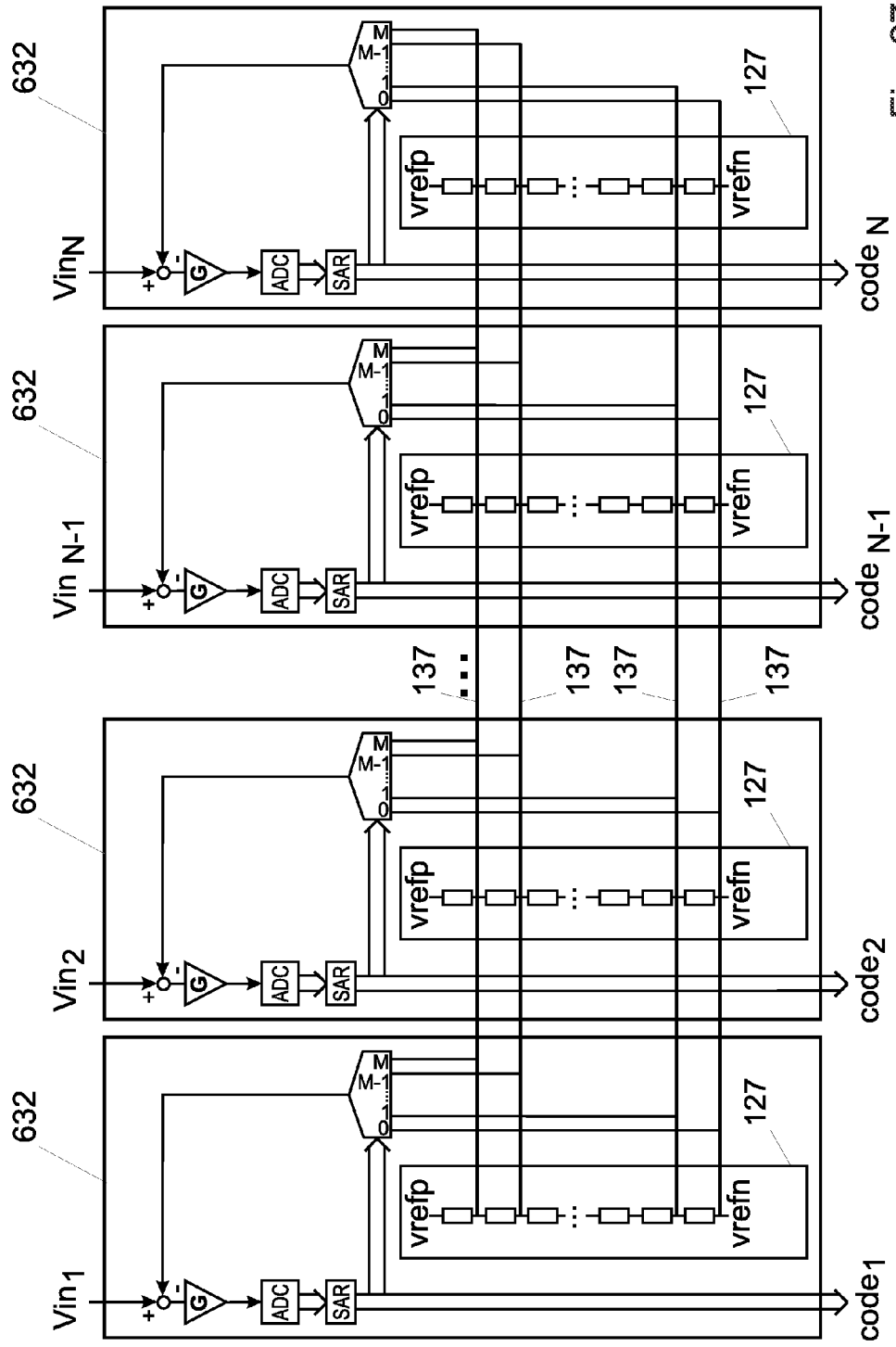

In the embodiment of the invention represented on FIG. 27, the corresponding taps of the resistive ladders 127 different channels are interconnected by a low resistance paths 137, so that the same reference levels are seen by all the channels, and in particular by adjacent channels. Doing so, not only the non-linearity of the resistive dividers or ladders 127 of the different channels is averaged but, importantly, the integral non-linearity is the same for all the channels. Therefore the readout system exhibits excellent spatial linearity.

Looking at FIG. 27, one can consider that the interconnected resistive dividers within each channel constitute a single global resistive divider, so this solution is equivalent to the embodiment of FIG. 28 where only a single resistive ladder 127 is present.

Figure 29A:
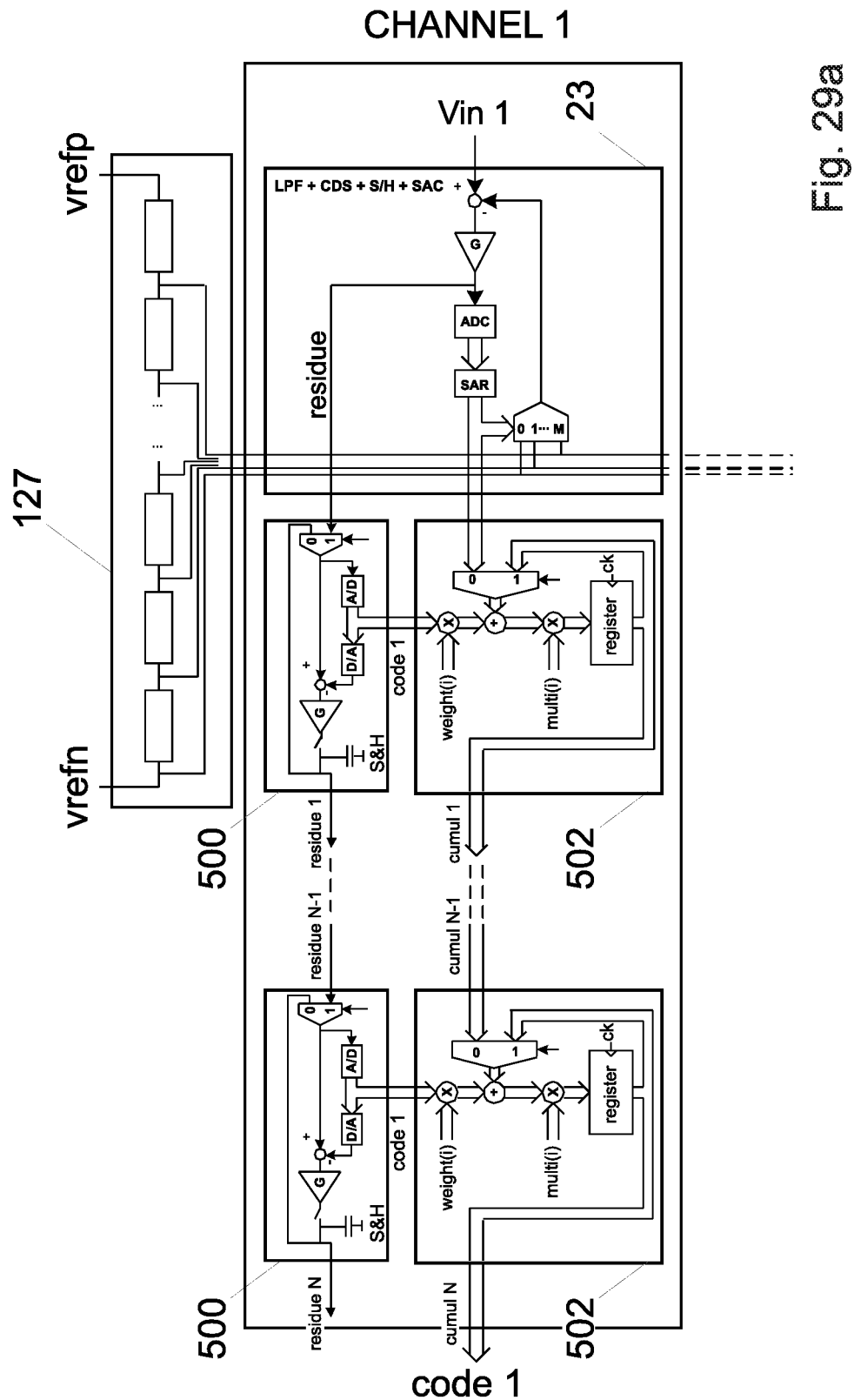
Figure 29B:
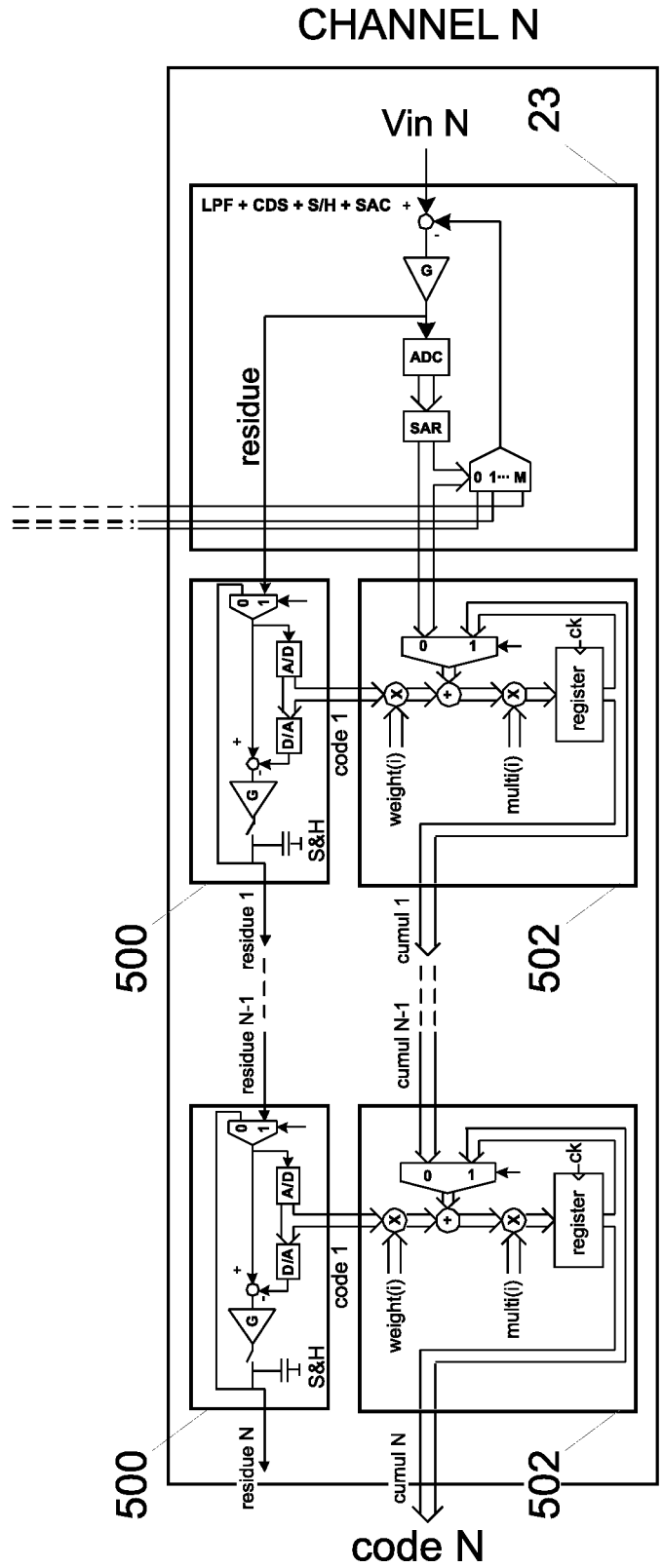

A possible embodiment of an ADC suitable for the circuit object of the invention is the combination of the circuit described in FIG. 28 with M-stages of cascaded algorithmic ADCs in pipeline described in FIG. 22, as shown in FIGS. 29a and 29b.

FIGS. 29a and 29b illustrate a row of fast ADC channels operating in parallel. The first stage 23 of each ADC channel is a successive approximation. The feedback DAC within each channel is a multiplexer selecting tabs from a resistive divider or ladder 127 which is common to all the channels for cancelling the effect of the mismatch between resistors within the different channels onto the spatial non-linearity.

The successive approximation ADC within the first stage can generate a residue signals which can be exploited by one or several next ADC stages to improve further the resolution, each of the next stage quantifying the residue of the previous stage (500) and adding the corresponding value to the code produced by the previous stage in order to compensate its approximation (502).

The advantage of this structure is that the non-linearity of each channel is basically dominated by that one of the resistive divider 127 (feedback path of the first stage), which should be common to all the channels. By this fact, the spatial non-linearity should be significantly improved.

In the present circuit the ADC in each channel considered as a whole can be a medium speed (conversion speed corresponding to the line frequency, of the order of 100 KHz typically) and relatively high resolution ADC (the number of bits being up to 16 bits).

The DAC in the feedback path of the successive approximation ADC can be a resistive DAC realized by selecting tabs from a resistive divider 127 which is shared by the ADC's of all channels. By this fact, the differential non-linearity is reduced because the DAC in feedback is intrinsically monotonic, while the spatial non-linearity is reduced because the non-linearity is basically determined by the resistive divider which is the same for all the channels.

In one embodiment the circuit comprises means for optimising the range of the charge integrator CSA and/or the correlated double sampler CDS integrated with the low pass filter LPF by offset variation, in order to compensate offsets generated by parasitic charges and then to detect very small charge levels, either positive or negative, even in the presence of these parasitic offsets.

A small offset compensation, i.e. a compensation enabling to detect very small charge levels, depending on the application, even in the presence of random parasitic offsets, consists of generating an initialisation output voltage of the CSA and/or the LPF+CDS at a medium level, which is between the maximum and minimum reference voltage of the ACD in order to compensate from parasitic charges of opposite signs.

Figure 30:
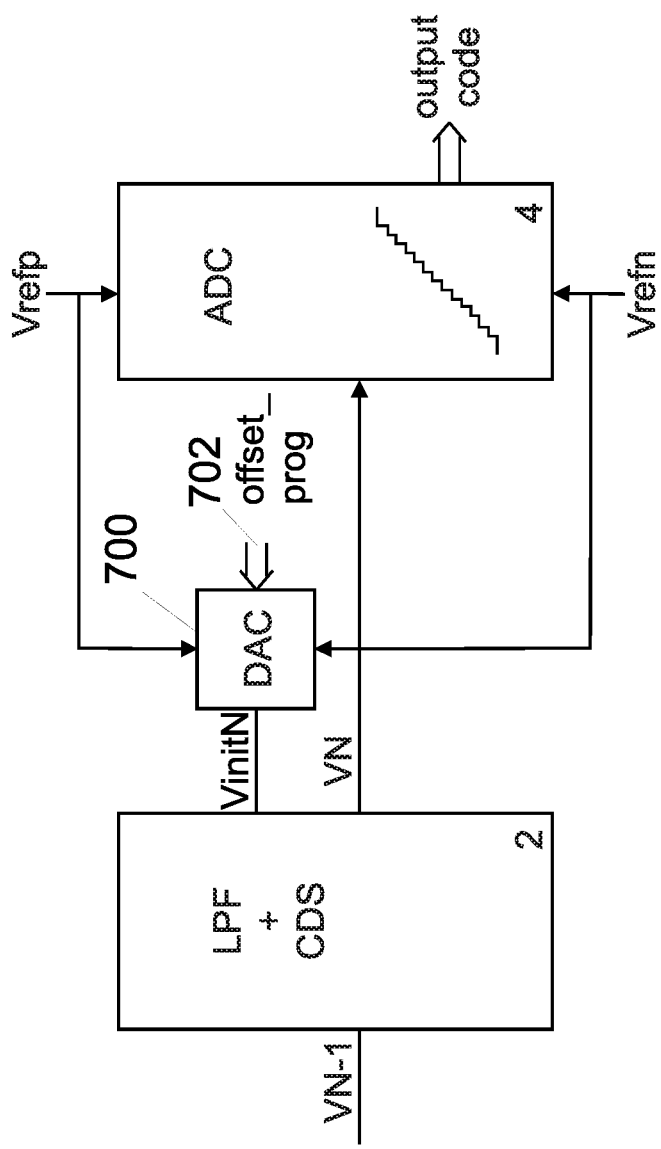
FIG. 30 illustrates one embodiment of the generation of a programmable initialization voltage of the LPF+CDS with a DAC.

In one embodiment, illustrated in FIG. 30, this initialisation is achieved by using a DAC 700 after the LPF+CDS which shares the same reference levels $V_{refp}$ and $V_{refn}$ with the ADC. A programmable and systematic offset 702, which is larger than the sum of all maximum expected parasitic offsets, is applied by using this DAC 700.

Figure 31:
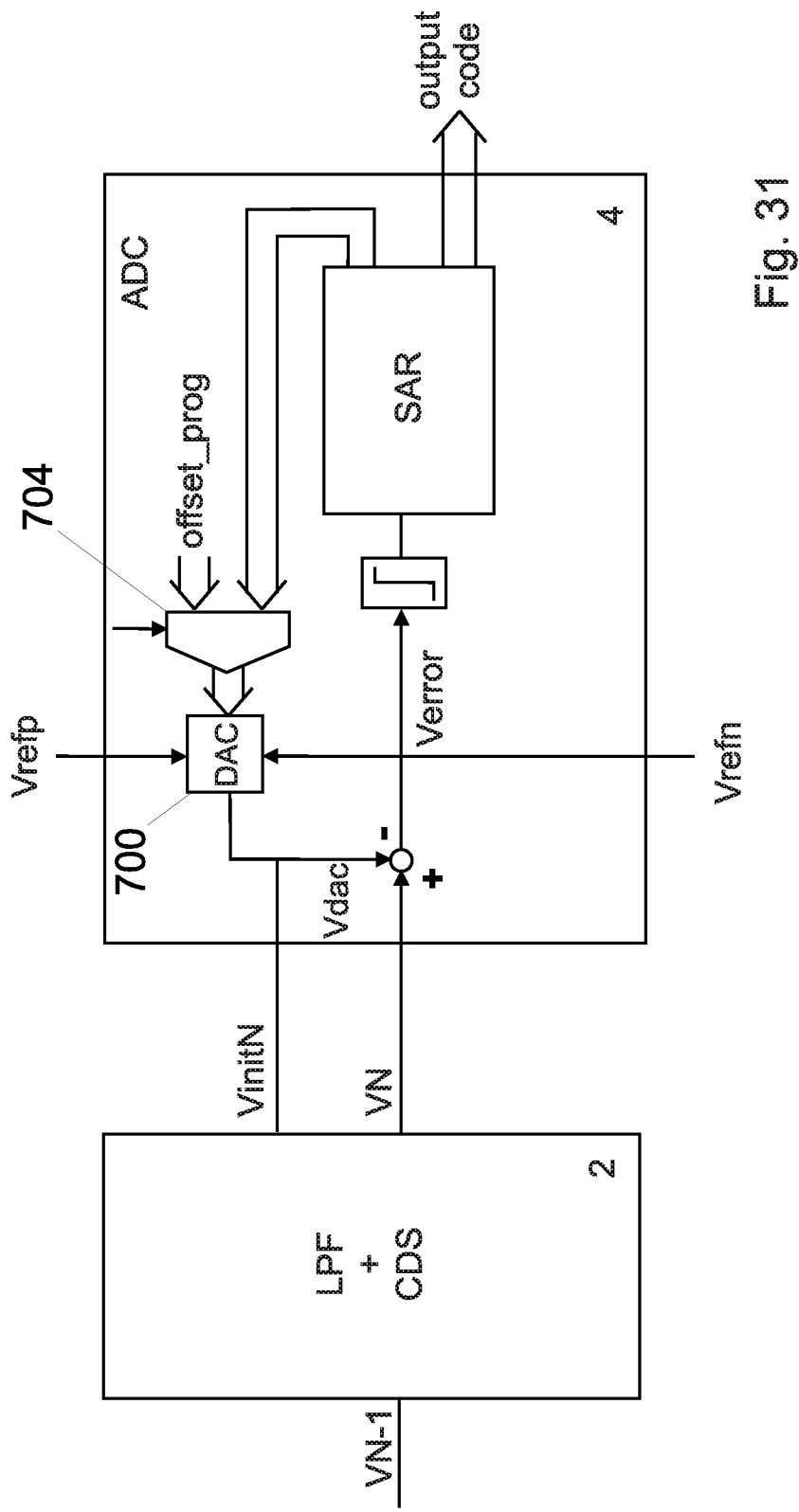
FIG. 31 illustrates the re-use of the DAC in feedback path of a SAC for generating a programmable initialization voltage of the LPF+CDS in a separated phase.

In the case wherein a successive approximation ADC is used, its feedback path includes a DAC which can be also exploited in a separated phase for applying the programmable and systematic offset. In such a case a multiplexer 704 is tied to this DAC 700 in order to manage both the offset and the feedback path (FIG. 31).

Figure 32:
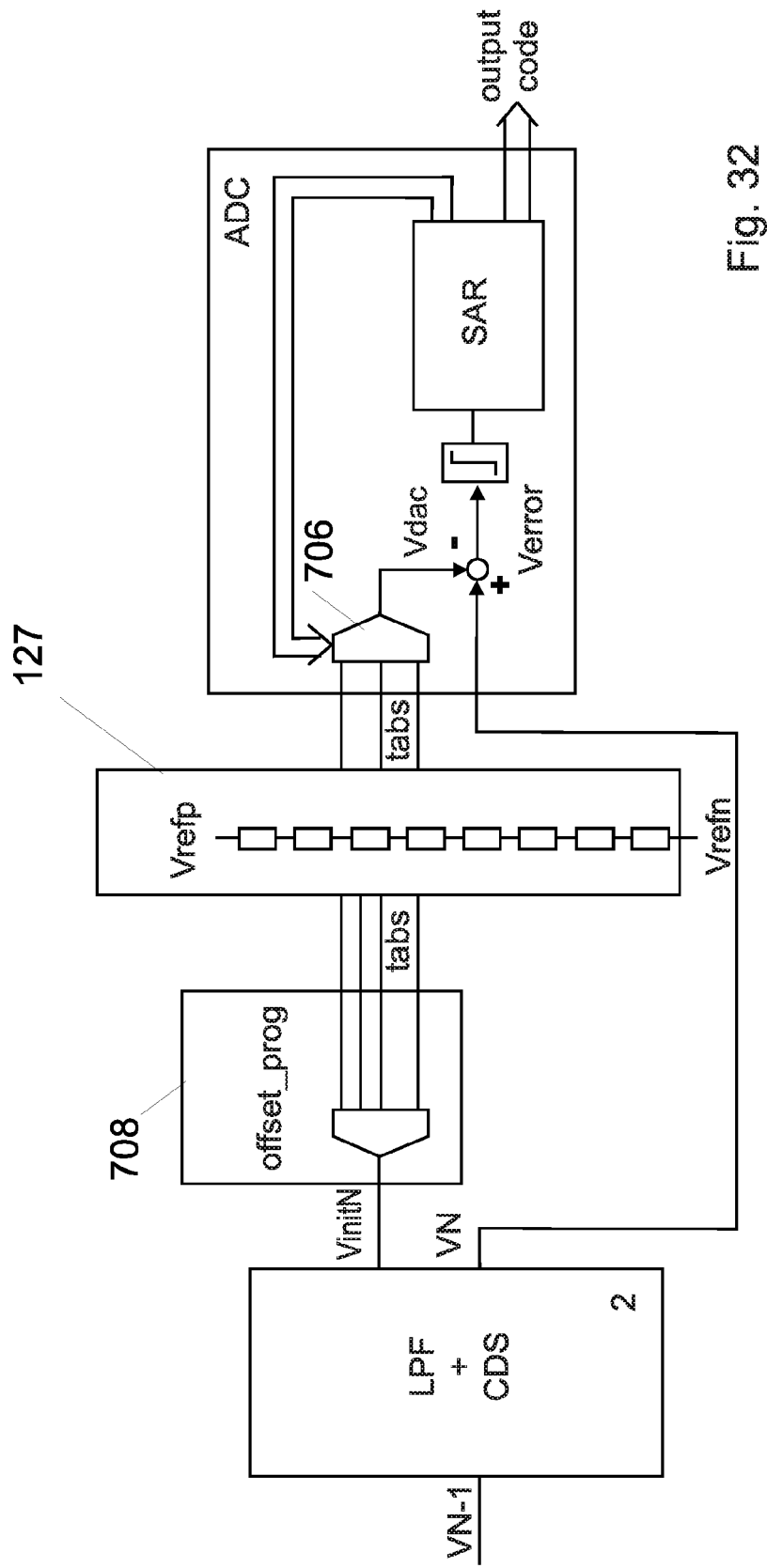
FIG. 32 illustrates the selection of the initialisation voltage from the same resistive divider as that one use in the feedback DAC of the ADC.

In a further embodiment, illustrated in FIG. 32, the DAC included in the feedback path is a resistive DAC based on a resistive ladder 127 and a multiplexer 706 in order to select the appropriate taps. In this case the initialization voltage of the LPF+CDS can be derived from the same resistive ladder 127 but with a further multiplexer 708.

Even if the initialization of the LPF+CDS is quite critical because it defines the input voltage and then the output code of the ADC corresponding to a null charge, and then the optimisation of the range of the overall circuit, the initialisation of the previous block, i.e. the CSA, can also be important in order to avoid signal clipping. In this embodiment the initialisation output voltage of the CSA can also be derived from the same resistive ladder 127 by using another multiplexer—not shown—for connecting it to the CSA.

In some cases, e.g. if the total charge to be integrated is always of the same sign and if the offset is larger than the charge range, depending on the application, the proposed solutions are not sufficient and a large offset compensation is needed. This large compensation consists of injecting a compensation charge $Q_{inj}$, the value of which is opposite to the charge offset, in the CSA or in a later block.

The amplitude value of the injected charge $Q_{inj}$ must be at least the minimum total charge to be detected, but not exceed the maximum total charge. In can simply be set as equal but opposite sign of the offset equivalent charge.

Figure 33:
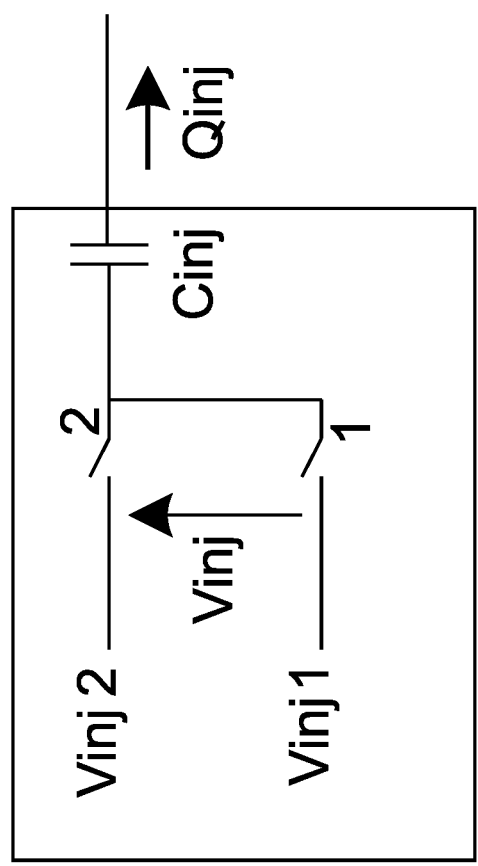
FIG. 33 illustrates one embodiment of the circuit for injecting a charge in a block of the circuit by switching a capacitor.

In one embodiment this charge is injected by using switched capacitor circuits (FIG. 33): a capacitor $C_{inj}$ is switched from value $V_{inj1}$ during the pre-charge to a value $V_{inj2}$ during the amplification phase, the total injected charge being $$Q_{inj}=C_{inj}(V_{inj2}-V_{inj1})=C_{inj}\cdot V_{inj}$$

In order to avoid drift of the output code, the injected charge should be proportional to the reference voltage of the DAC, so that $V_{inj1}$ and $V_{inj2}$ should best be selected from $V_{refp}$ of $V_{refn}$ or from tabs from a resistive divider between $V_{refp}$ and $V_{refn}$.

The capacitor $C_{inj}$ for charge injection should also be matched with the other capacitors in order also to reduce the drifts and thermal dependency.

The invention claimed is:

1. A circuit for capacitive touch applications comprising:
   a charge integrator;
   a low pass-filter and a correlated double sampler sharing a common capacitor, the common capacitor acting as an input capacitor to the correlated double sampler and as a filtering capacitor to the low pass-filter;
   a sampler and holder;
   an analog-to-digital converter (ADC) comprising a multi-stage switched capacitor analog-to-digital converter having a first stage and further stages, said first stage comprising a successive approximation register and a feedback digital-to-analog converter (DAC), wherein said sampler and holder is integrated in said first stage of said analog-to-digital converter, and wherein an amplifier is shared between said sampler and holder and said first stage of said analog-to-digital converter;
   said low pass-filter having a cut-off frequency lower than the Nyquist frequency of the sampler and holder; and
   said low pass filter comprising said input capacitor and a serial resistor.

2. The circuit of claim 1, wherein said low-pass filter and said correlated double sampler are integrated in a single block.

3. The circuit of claim 1, wherein said further stages comprise a pipeline ADC or an algorithmic ADC or two or more cascaded components, each cascaded component being an algorithmic ADC.

4. The circuit of claim 1, wherein said low pass filter, said correlated doubler sampler, said sampler and holder and said first stage of said analog to digital converter are integrated in a single block.

5. The circuit of claim 4, wherein a capacitor is shared between said sampler and holder integrated in said first stage of said analog-to-digital converter and said single block integrating said low-pass filter and said correlated double sampler.

6. The circuit of claim 4, wherein said single block comprises
   said serial resistor connected between the output of said charge integrator and said input capacitor
   said input capacitor connected between said serial resistor and an input switch
   said input switch connected between said input capacitor and a virtual ground of an amplifier
   said amplifier
   a reset switch for said amplifier, connected between said virtual ground and the output of said amplifier
   a feedback capacitor, connected between said virtual ground and a node, said node being connected to a first pre-charging switch, to a second feedback switch and a third switch, said third switch being connected to a digital to analog converter
   said first pre-charging switch, said second feedback switch, said third switch and said digital to analog converter
   a comparator connected to the output of said amplifier.

7. The circuit of claim 6, wherein said amplifier integrates the functions of the amplifiers of both said correlated double sampler and said first stage of said analog to digital converter.

8. The circuit of claim 7, further comprising
   a residue capacitor connected between the virtual ground of said amplifier and a node, said node being connected to a fourth pre-charging switch and a fifth switch, said fifth switch being connected to the output of said amplifier
   said fourth pre-charging switch and said fifth switch.

9. The circuit of claim 1, wherein the circuit is part of a capacitive touch device comprising:
   an array comprising a first number of rows and a second number of columns of sensing capacitors;
   a generator for generating an input signal and for addressing said input signal to each of said rows at a row scan rate;
   second number of the circuit.

10. The circuit of claim 9, wherein each of the ADCs in said circuits comprises a DAC, said capacitive touch device comprising a plurality of voltage reference unit providing a plurality of reference voltages to said DACs of several ADCs of said ADCs.

11. The circuit of claim 10, wherein said reference unit is a resistive ladder.

12. The circuit of claim 10, wherein said reference unit includes one reference ladder that is common between said circuits and having a plurality of taps, said reference voltage being present at said taps.

13. The circuit of claim 9, wherein said ADCs are arranged to generate a residue signal which is encoded by one or several further ADC stages.

* * * * *